(12) United States Patent
Toraichi et al.

(10) Patent No.: US 7,652,610 B2
(45) Date of Patent: *Jan. 26, 2010

(54) SIGNAL PROCESSING DEVICE AND METHOD, SIGNAL PROCESSING PROGRAM, AND RECORDING MEDIUM WHERE THE PROGRAM IS RECORDED

(75) Inventors: Kazuo Toraichi, Tukuba (JP); Kazuki Katagishi, Tukuba (JP); Kouji Nakamura, Tukuba (JP); Yasuo Morooka, Hitachi (JP)

(73) Assignee: Japan Science and Technology Agency, Kawaguchi, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/213,255

(22) Filed: Jun. 17, 2008

(65) Prior Publication Data

US 2008/0258958 A1 Oct. 23, 2008

Related U.S. Application Data

(62) Division of application No. 10/591,469, filed on Jul. 20, 2007, now Pat. No. 7,463,172.

(30) Foreign Application Priority Data

Mar. 3, 2004 (JP) ............................. 2004-058704
Mar. 3, 2004 (JP) ............................. 2004-058712
Apr. 28, 2004 (JP) ............................. 2004-132535

(51) Int. Cl.
*H03M 1/12* (2006.01)

(52) U.S. Cl. ...................... 341/155; 341/110; 341/114; 341/142; 375/223; 375/261; 375/346; 375/350

(58) Field of Classification Search ................. 341/110, 341/114, 144, 155; 375/223, 261, 346, 350
See application file for complete search history.

(56) References Cited

U.S. PATENT DOCUMENTS 4,755,889 A * 7/1988 Schwartz .................... 360/32

(Continued)

FOREIGN PATENT DOCUMENTS

JP        7239679       9/1995

(Continued)

OTHER PUBLICATIONS

Encyclopedia Electronics, Information and Communication Handbook, Ohmsha, Ltd., Publishing, The Institute of Electronics, Information and Communication Engineers, Ed., $4^{th}$ group, pp. 394-396 and pp. 415. English Translation.

(Continued)

*Primary Examiner*—Linh V Nguyen
(74) *Attorney, Agent, or Firm*—Brundidge & Stanger, P.C.

(57) ABSTRACT

A signal processing device which outputs a discrete signal composed of a string of the sampling values and parameters m signal. The signal processing device includes a sampling circuit which samples an input signal and outputs a discrete signal, multiple function generators which generate multiple sampling functions with parameters m different from each other, plural inner product operating units for each of parameters m that take an inner product between the input signal and each of plural sampling functions and output an inner product operating value, and a judging unit which determines parameter m providing a minimum error out of multiple errors composed of differences between the sampling value and inner product operating values output from the multiple inner product operating units and outputs the parameters m signal.

7 Claims, 25 Drawing Sheets

U.S. PATENT DOCUMENTS

| | | | |
|---|---|---|---|
| 5,654,982 A * | 8/1997 | Goodson et al. | 375/222 |
| 6,255,968 B1 * | 7/2001 | Kitagawa | 341/87 |
| 6,512,989 B1 * | 1/2003 | Deome et al. | 702/124 |
| 7,088,276 B1 * | 8/2006 | Wegener | 341/155 |
| 7,145,490 B2 * | 12/2006 | Yang et al. | 341/139 |
| 7,463,172 B2 * | 12/2008 | Toraichi et al. | 341/110 |
| 2004/0023677 A1 * | 2/2004 | Mano et al. | 455/500 |
| 2004/0151097 A1 * | 8/2004 | Miyashita et al. | 369/53.16 |
| 2005/0135631 A1 * | 6/2005 | Yoshino | 381/59 |
| 2006/0267825 A1 * | 11/2006 | Fujiyama et al. | 341/155 |
| 2007/0104301 A1 * | 5/2007 | Esumi et al. | 375/346 |
| 2007/0121718 A1 * | 5/2007 | Wang et al. | 375/233 |
| 2007/0265813 A1 * | 11/2007 | Unal et al. | 703/2 |

FOREIGN PATENT DOCUMENTS

| | | |
|---|---|---|
| JP | 2001051979 | 2/2001 |

OTHER PUBLICATIONS

M. Obata, et al "An Approximation of Data Points by Piecewise Polynomial Functions and Their Dual Orthogonal Functions", Signal Processing Elsevier Science Publishers B.V. Amsterdam, NL, vol. 80, No. 3, Mar. 1, 2000, pp. 5-7-514.

* cited by examiner

SIGNAL PROCESSING DEVICE AND METHOD, SIGNAL PROCESSING PROGRAM, AND RECORDING MEDIUM WHERE THE PROGRAM IS RECORDED

The present application is a divisional application of application Ser. No. 10/591,469, filed Jul. 20, 2007, now U.S. Pat. No. 7,463,172 the contents of which are incorporated herein by reference.

TECHNICAL FIELD

The present invention relates to a signal processing device and a signal processing method for generating discrete signals by using sampling from signals which change in time such as video (moving picture), image, and audio signals or those used for measurement and control. Moreover, the invention relates to a technology of reproducing the original signals from the discrete signals of images such as text, diagrams, photos and printouts, video including moving pictures, audio, measurement results, and the like. Specifically, the invention concerns a signal processing device and a signal processing method for extracting changing points where signal state change.

BACKGROUND ART

Recently, the digital signal technology has advanced in various fields targeted for videos (moving pictures), images, or audios such as fields of communication, broadcasting, recording media including CDs (Compact Discs) and DVDs (Digital Versatile Discs), medical images, and printing. These fields have remarkably developed as multimedia industries or IT (Information Technology). Compressing coding to decrease the amount of information performs a role of the digital signal technology for videos, images, and audios. The signal theory representatively includes the Shannon's sampling theorem and, what is newer, the wavelet transform theory (see non-patent document 1) and the like. While music CDs use the linear PCM (Pulse Code Modulation) without compression, for example, the signal theory to be applied is also the Shannon's sampling theorem.

There is disclosed the apparatus (e.g., see patent document 1) to create large display objects such as signboards, posters, banners, and the like. For example, the apparatus create the large display objects by making original graphics data, the original graphics being such as text, diagrams, and the like drawn on A4-size sheets of paper, and outputting the data of the original graphics onto printers, cutting plotters, and the like.

Further, patent document 2 discloses the data processing method as follows. The method generates multiple discrete data strings based on multiple functions categorized by differentiatable times. The method performs correlative calculation between input data and the multiple discrete data strings. Based on a correlative calculation result, the method finds a peculiar point contained in the input data to specify a class (m) to which the object signals belong.

Non-patent document 1: The Institute of Electronics, Information and Communication Engineers, ed. "ENCYCLOPEDIA Electronics, Information and Communication Handbook" published by Ohmsha, Ltd., the fourth group, pp. 394-396 and p. 415.

Patent document 1: Japanese Patent Laid-open No. H07-239679

Patent document 2: Japanese Patent Laid-open No. 2001-51979

DISCLOSURE OF INVENTION

Like compression coding or non-compression coding as mentioned above, there is a system that converts an input signal into a digital signal and then reproduces the original analog signal. Such system can be generalized as an A-D/D-A conversion system. A well-known A-D/D-A conversion system based on the Shannon's sampling theorem handles signals whose bands are limited by the Nyquist frequency. In this case, the D-A conversion uses a function (regular function) to reproduce signals within a limited band for reproduction of sampled discrete signals to continuous waves.

One of the inventors found that a fluency function can be used to categorize various properties of signals such as videos (moving pictures), images such as text, diagrams and natural pictures, or audios and the like. According to this theory, the regular function based on the Shannon's sampling theorem is one of fluency functions and remains to be applied to one of various properties of signals. When signals with various properties are handled with only the regular function based on the Shannon's sampling theorem, there may be a possibility of limiting the quality of reproduction signals after the D-A conversion.

The above-mentioned wavelet transformation theory is for representing signals using a mother wavelet that decomposes an object by resolution. However, the signals are not always provided with an optimum mother wavelet. Again, there may be a possibility of limiting the quality of reproduction signals after the D-A conversion.

The fluency function is categorized by parameter m (where m is a positive integer from 1 to $\infty$). In parameter m, m denotes that the function is continuously differentiatable only as often as (m−2) times. Since the above-mentioned regular function is differentiatable at any number of times, m is set to $\infty$. Further, the fluency function is composed of functions of degree (m−1). Particularly, a fluency DA function of fluency functions is given a numeric value at the k-th targeted sampling point $k\tau$, where $\tau$ is a sampling interval. The fluency DA function becomes 0 at the other sampling points.

All signal properties can be classified by the fluency function having parameter m and can be categorized into classes by parameter m. Accordingly, the fluency information theory using fluency functions includes the Shannon's sampling theorem, the wavelet transformation theory, and the like that represent only part of signal properties as conventionally practiced. And, the fluency information theory is positioned as a theoretical system representing the whole of signals. It is expected that the use of such functions allows the D-A conversion to yield unexceptionally high-quality reproduction signals whose bands are not limited by the Shannon's sampling theorem.

The data processing method as described in patent document 2 finds a peculiar point as a result of the correlative calculation to specify class m. However, the correlative calculation is time-consuming and is disadvantageous to fast processing. Accordingly, there has been not realized a signal processing device that effectively generates discrete signals from a continuous waveform signal based on the fluency information theory. When the continuous waveform signal is an analog signal and the discrete signal is output as a digital signal, the signal processing device functions as an A-D converter.

The device disclosed in patent document 1 that transforms original images into data broadly comprises a structure to extract outlines of text and diagrams, a structure to extract joints and their positions from curvature data, a structure to approximate the outlines using functions (lines, arcs, and piecewise polynomials), a device to store coordinate data of the joint and approximate function data, and a structure to reproduce the outlines from the stored data.

Changing points where an outline changes include joints as joining of a line or a curve. The outline largely changes at a portion near such joints. Accordingly, such portion is not represented by lines or arcs, but free curves, i.e., piecewise polynomials. The joints are found as a point with a large curvature given by the piecewise polynomials. The joint causes an angle to largely change at a minute portion, i.e., causes a differential coefficient to largely change. Differential processing is used to extract joints that are found as points with large curvatures.

An image is reproduced by drawing lines or curves between the changing points including joints using the above-mentioned approximate functions. Accordingly, correctly extracting changing points is important for accurate reproduction.

When a scanner is used to read original images of text and diagrams, for example, an outline is inevitably subject to jaggy or rough portions to some extent due to a sensor noise, scanner resolutions, and the like. The jaggy or rough portions result from superposing noises which include a lot of fine and high-frequency components on the original image. When the differential processing is used to find changing points including joints, the jaggy or rough may deviate positions for extracting changing points, or may be incorrectly extracted as changing points. There may be a possibility of failing to acquire accurate changing points.

This problem will be described in more detail with respect to text, diagrams, images, and videos (hereafter generically referred to as images). A continuously changing signal may often change sharply or stepwise. Such signal changing point is corresponding to an information changing points (switching points or peculiar point) where signal properties or characteristics change.

In case of image information, one screen or area contains many small images. When the image is processed, it is divided into minute areas (referred to as pixels) horizontally and vertically at a specified interval. The image is processed in such a manner as recognizing, enlarging, transforming, and synthesizing areas (small image domains) composed of the same information in units of pixels. When small image domains are recognized, it becomes a subject to detect domain ends (edges). A conventional method has been used to recognize a point where information about colors or brightness remarkably changes (a difference or a differential value greatly changes) as a changing point. The changing point corresponds to a switching point or a peculiar point of information to be described later. When differences or differential values of data are used for the changing point detection, however, there is a defect that noise may occur to change the image information and cause incorrect recognition. In addition, an image is enlarged in units of pixels. When an image is enlarged n times horizontally and vertically, for example, pixel information of an area of n2 becomes the same information. Consequently, the image is subject to stepwise changes in both small area's outlines and the inside color information.

To solve the above-mentioned problems, there is proposed a method of processing signal strings based on the function approximation. In this case, it is important to accurately recognize an information range of the same property, i.e., the length of a continuous signal and a small area domain (image outline). A method of extracting end points of the signal length and the domain outline is compliant with conventional methods of using data differences, differential signals, color differences, and luminance differences concerning the stored information, i.e., methods included in the differential processing.

As mentioned above, the fluency function can be used to classify various properties of signals electrically acquired from images such as text, diagrams, and natural pictures, videos, or audios. Furthermore, one of the inventors found that the processing for this classification can be used to find changing points without using the differential processing. When a discrete signal is generated from a continuous waveform signal based on the fluency information theory, for example, the above-mentioned changing point can be acquired during that processing without using the differentiation, as will be described later. However, there has been not realized such signal processing device that can generate the changing points.

The function for acquiring a discrete signal from a continuous waveform signal based on the fluency information theory is theoretically developed in detail and is defined as a sampling function in this description, as will be described later. The sampling function may be referred to as a fluency AD function. The function for acquiring a continuous waveform signal from a discrete signal is defined as an inverse sampling function in this description. The inverse sampling function may be referred to as a fluency DA function. The sampling function and the inverse sampling function defined as such maintain the orthogonal with each other and are expressed through the use of parameter m.

Let us suppose that a signal system acquires a discrete signal from a continuous waveform signal based on the fluency information theory and then acquires a continuous waveform signal from the acquired discrete signal. In order for such signal system to function, parameter m needs to be recognized at a side that acquires the continuous waveform signal. (For example, there may be an A-D/D-A conversion system that AD-converts an analog signal based on the fluency information theory and DA-converts the acquired digital signal. In order for the A-D/D-A conversion system to function, parameter m needs to be recognized at the D-A conversion side.)

This parameter m is found as follows. As will be described later, a signal processing (e.g., A-D conversion) for acquiring discrete signals takes an inner product between an input signal of continuous waveform and the sampling function to acquire a discrete signal as a sampling value string. At this time, parameter m represents an input signal property and is assumed to be l (el). When parameter l differs from parameter m (assumed to be $m_0$) for the sampling function, the inner product operating value resulting from the inner product differs from a sampling value for the input signal at the sampling point. An error occurs between both. When the value $m_0$ in which this error may become zero (actually, it becomes the minimum), selecting such $m_0$ causes l=$m_0$. Accordingly it becomes possible to determine parameter m from a signal that is unknown in l.

The value of $m_0$ together with the discrete signal as a sampling value string (or the discrete signal composed of a string of inner product operating values with the determined parameter m) may be transmitted to the signal processing side (e.g., the D-A conversion side) to acquire continuous waveform signals. This signifies a signal processing (e.g., a D-A conversion) using the inverse sampling function with parameter $m_0$ to easily reproduce a high-quality continuous waveform signal almost equal to the input signal.

The following outlines a representative embodiment of the invention disclosed in this application.

A signal processing device comprises a sampling circuit that samples an input signal and outputs a discrete signal composed of a string of sampling values, a plurality of function generators that generate sampling functions with parameters m different from each other; a plurality of inner product operating units for each of parameters m that take an inner product between the input signal and the sampling function and output an inner product operating value, and a judging unit that determines parameter m providing a minimum error out of a plurality of errors derived from differences between the sampling value and inner product operating values output from the plurality of inner product operating units and outputs the parameter m signal, wherein a discrete signal composed of a string of the sampling values and the parameter m signal are outputted.

It is assumed that a signal processing generates a continuous waveform signal from a discrete signal acquired by the signal processing device according to the invention. During such signal processing, the parameter m signal may be used to select an inverse sampling function with the parameter m. In this manner, it is possible to generate a continuous waveform signal using the inverse sampling function with parameter m corresponding to the parameter m to which the discrete signal belongs. That is, the invention makes it possible to easily acquire a signal to reproduce a high-quality continuous waveform signal free from limitation on bands according to the Shannon's sampling theorem.

The following outlines another representative embodiment of the invention disclosed in this application.

A signal processing device comprises a plurality of function generators that generate inverse sampling functions with parameters m different from each other, when input signals include a discrete signal for an original signal belonging to parameter $m_0$ of the parameters m and a parameter m signal indicating the parameter $m_0$, a function selector that uses the parameter m signal of the input signals to select an inverse sampling function with the parameter $m_0$ out of the inverse sampling functions, and a convoluting integrator that performs convolution integration between the discrete signal and the selected inverse sampling function with parameter $m_0$ to acquire a continuous waveform signal.

The signal processing device according to the invention uses the parameter m signal to notify parameter $m_0$ to which a discrete signal belongs. It is possible to acquire a continuous waveform signal by using the inverse sampling function corresponding to a fluency signal space (to be described) to which the discrete signal belongs. That is, the invention makes it possible to easily reproduce a high-quality continuous waveform signal free from limitation on bands according to the Shannon's sampling theorem.

During a processing to determine the parameter m, a changing point belongs to points where parameter m cannot be specified. Points incapable of specifying parameter m are broadly classified into a point where no differentiation is possible (including points where a signal becomes discontinuous), and a point where a signal is continuous and the differentiation is possible but parameter m changes before or after that point. The former includes a point before or after which parameter m does not change. Such point is exemplified by a polygonal line's joining with m=2. The point before or after which parameter m changes is generically referred to as a class switching point. The point where no differentiation is possible is generically referred to as a peculiar point. (The point functioning as a class switching point and a peculiar point is referred to as an ultra peculiar point.)

When the image is text and a diagram in the XY coordinate system and an outline is found, for example, let us find x and y coordinates of each point on the outline that is divided into small spans. When the small span is assumed to be an intermediate variable, following result can be obtained. The resulting outline locus contains x coordinates of each point in the coordinate system composed of X as the ordinate and the small span as the abscissa. The resulting outline locus contains y coordinates of the points in the coordinate system composed of Y as the ordinate and the small span as the abscissa.

These two loci are also handled based on the fluency information theory. That is, a continuous waveform signal is assumed to be the locus. A domain is composed of multiple small spans whose separating points are assumed to be sampling points. Each sampling point has x and y coordinates that are assumed to be sampling values. Under these conditions, the sampling function is used to detect a changing point, i.e., a point where parameter m cannot be specified. The domain composed of multiple small spans is equivalent to a sampling interval. The detection provides the targeted changing point. Accordingly, when there is given an approximate function representing the outline, the image is highly accurately reproduced by drawing a line or a curve between the detected changing points using the approximate function.

As mentioned above, on the assumption that there is given the approximate function representing the outline, the invention is applied to the signal processing device and the signal processing method for outputting signals representing changing points. Further, on the assumption that the reproduction uses the inverse sampling function, the invention is applied to the signal processing device and the signal processing method for outputting signals representing changing points and parameter m and discrete signals.

The following outlines still another representative embodiment of the invention disclosed in this application. That is, a signal processing device comprises a sampling circuit that samples an input signal to acquire a sampling value, a plurality of function generators that generate sampling functions with parameters m different from each other, and a plurality of inner product operating units for each of parameters m that take an inner product between the input signal and the sampling function and output an inner product operating value, wherein, when there is a point at which a plurality of differences between the sampling value and inner product operating values output from the plurality of inner product operating units exceeds a specified threshold value with respect to any parameters m, the signal processing device determines the point to be a changing point and outputs a changing point signal indicating the changing point.

Still another signal processing device comprises a sampling circuit that samples an input signal and outputs a discrete signal composed of a string of sampling values, a plurality of function generators that generate sampling functions with parameters m different from each other, a plurality of inner product operating units for each of parameters m that take an inner product between the input signal and the sampling function and output an inner product operating value, a class judging unit that determines parameter m providing a minimum error out of a plurality of errors derived from differences between the sampling value and inner product operating values output from the plurality of inner product operating units and outputs the parameter m signal, and when there is a point at which the difference exceeds a specified threshold value with respect to any parameters m, a changing point judging unit that determines the point to be a changing point and outputs a changing point signal indicating the changing point, wherein a combination of the discrete signal, the parameter m signal, and the changing point signal are outputted.

As mentioned above, the changing point signal is found based on an inner product operation. The inner product operation uses the integration to process signals and can provide changing points without differentiation. This makes it possible to solve incorrect recognition of changing points due to noise and problems unsolvable on moving pictures. That is, the integration is used to process signals, making it possible to decrease effects of noise signals and highly accurately detect signal changes. Accordingly, it is possible to solve the problems of the prior art and more reliably detect signal changing points and the other points where information characteristics change.

BEST MODE FOR CARRYING OUT THE INVENTION

Figure 1:
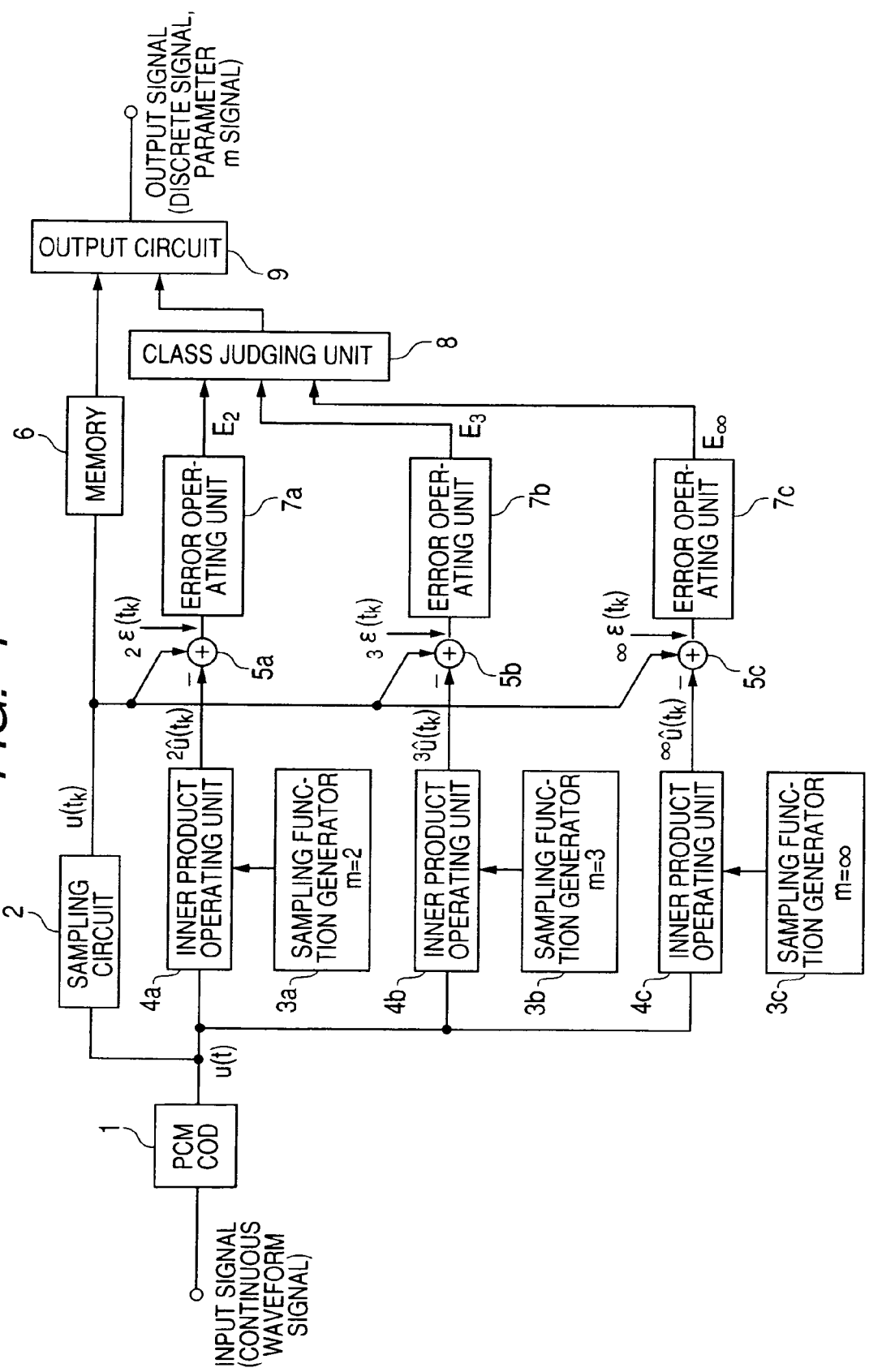
FIG. 1 is a configuration diagram showing a first embodiment of a signal processing device according to the invention.

With reference to the diagrammed embodiments, the following describes in further detail a signal processing device and method, a signal processing program, and a recording medium where the program is recorded according to the invention. Throughout all the drawings used to show the embodiments, the same reference numerals depict the same components or equivalents.

FIG. 1 shows a first embodiment of a signal processing device according to the invention. The signal processing device uses the sampling function to acquire a discrete signal from a continuous waveform signal based on the fluency information theory. The embodiment aims at videos and images, and parameter m is set to three types 2, 3, and ∞. This is because an analysis result shows that three parameters m=2, 3, and ∞ cover almost all signal properties of signals acquired from videos and images. The invention is not limited to these three parameters. Obviously, it may be preferable to choose four parameters, i.e., m=1, 2, 3, and ∞, for example, when diagrams are also included.

Figure 2:
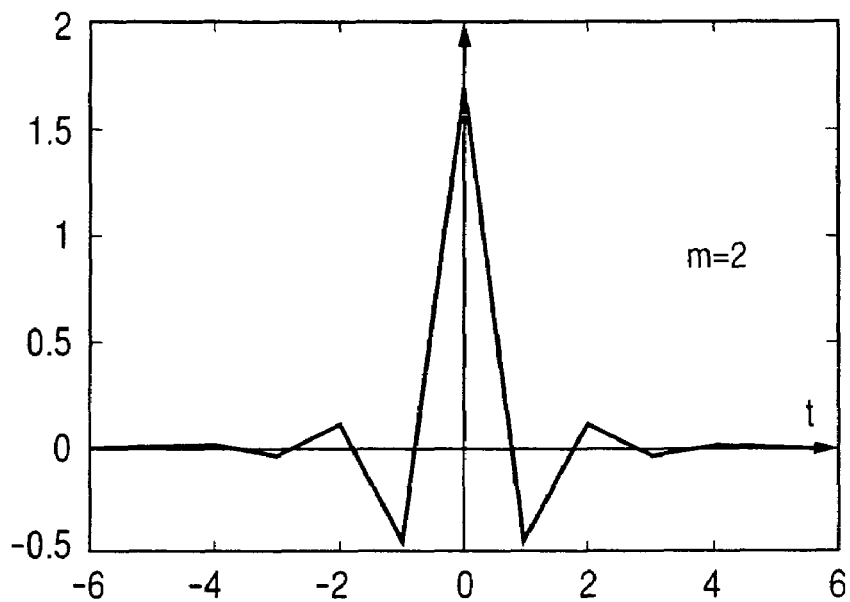
FIG. 2 is a graph exemplifying the sampling function with m=2.
Figure 3:
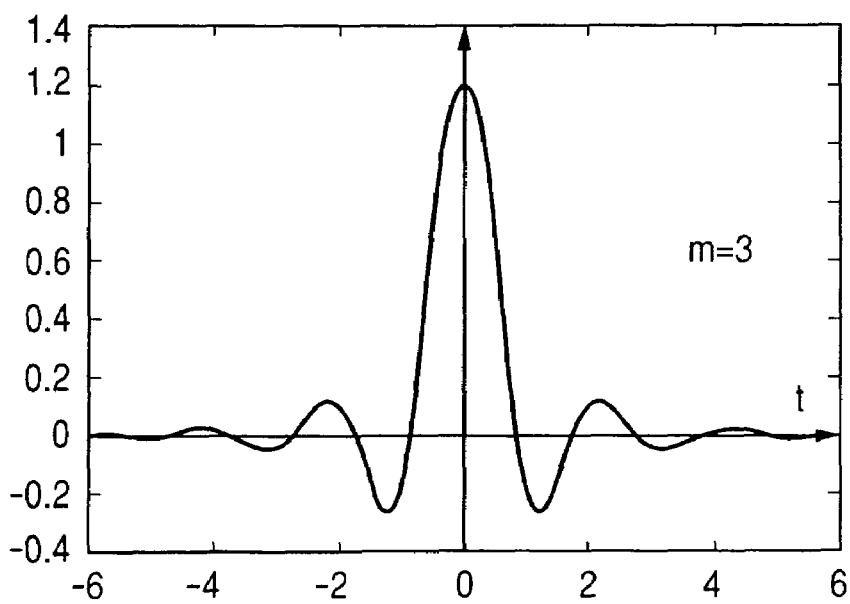
FIG. 3 is a graph exemplifying the sampling function with m=3.

According to the embodiment, the digital signal processing generates a discrete signal from a continuous waveform signal. For this reason, an analog input signal is once sampled at an interval sufficiently shorter than sampling interval ∞ and then is PCM encoded. Further, the sampling function with m=2 or 3 is settled within the finite span 0 to (J−1)τ, where J is the number of sampling points and (J−1)τ is the length. An inner product is also taken for each sampling point within this range. FIGS. 2 and 3 exemplify the sampling functions with m=2 and 3, respectively. Each sampling function uses function span J=13.

The sampling function with m=∞ infinitely continues oscillation. Accordingly, the embodiment limits the span for this function to the same span for the function with m=2 or 3. A resulting slight error is allowable. To increase the processing accuracy for m=∞, the range of inner product can be wider than the above-mentioned one.

In FIG. 1, reference numeral 1 denotes a PCM coder (PCMCOD) to sample and code analog input signals at an interval sufficiently shorter than sampling interval τ; 2 denotes a sampling circuit to sample the coded input signal output from the PCM coder 1 at sampling interval τ and output a sampling value at sampling point $k\tau=t_k$; 3 denotes sampling function generators to generate sampling functions with m=2, 3, and ∞ from top to bottom; 4 denotes an inner product operating unit to calculate an inner product between an input signal and the sampling function based on span 0 to (J−1)τ and output an inner product operating value; and 5 denotes a subtracter to subtract an inner product operating value output by the inner product operating unit 4 from a sampling value output by the sampling circuit 2 and output a difference. A file device (not shown) previously stores sampling functions with m=2, 3, and ∞ the sampling function generator 3 outputs. The functions are read each time an inner product is operated.

An error operation is performed to the above-mentioned difference, and then comparison to the results of the error operation is performed to determine parameter m. The error operation uses a sum of squares or an arithmetic sum of absolute values for the differences depending on input signal properties. A sum operation is applied to errors at each sampling point ($t_k$, $t_{k+1}$, ..., and $t_{k+(N-2)}$) within the span 0 to (N−1)τ. Another available error operation may select an absolute value for the maximum difference in an operation span. The operation span is represented by N. Relatively large values are selected for N when a still picture is used as an input signal and is processed offline. Small values including N=1 are selected for N when a moving picture is used as an input signal and is processed on a real-time basis. This is because parameter m needs to be determined fast. In this manner, any values are selected for N depending on signal properties. In the case of N=1, no sum is performed and the comparison is performed at the sampling points to determine parameters m.

Further, in FIG. 1, reference numeral 7 denotes an error operating unit to perform the above-mentioned error operation for differences at each of the sampling points within the span 0 to (N−1)τ; and 8 denotes a class judging unit that has a comparator, compares error operation results concerning parameters m=2, 3, and ∞ from the error operating unit 7 to detect the minimum parameter, and outputs a parameter m signal indicating that parameter m. Reference numeral 6 denotes memory for adjusting a time delay due to processing by the error operating unit 7 and the class judging unit 8 with reference to sampling values output from the sampling circuit 2.

The sampling circuit 2 outputs a sampling value at every sampling interval τ to form a string of sampling values that then result in a discrete signal. In FIG. 1, reference numeral 9 denotes an output circuit that combines the discrete signal with the parameter m signal to form and output a digital output signal. The combination is performed by packetizing the discrete signal and placing the parameter m signal in the discrete signal's header, for example. The parameter m signal only needs to be capable of identifying one of three parameters m=2, 3, and ∞ and therefore can be represented using a 2-bit code, for example. The discrete signal and the parameter m signal may be output individually instead of being combined with each other.

A signal at each connecting point in FIG. 1 is shown as follows.

Input signal supplied to the inner product operating unit 4: u(t)

Sampling value for the input signal: $u(t_k)$

Sampling value (inner product operating value) resulting from an inner product operation:
$^m\hat{u}(t_k)$ Error in output from the subtracter: $_m\epsilon(t_k)$ Error operation value: Em The signal processing device according to the embodiment can be constructed as hardware using digital circuits and memory for the corresponding components. The signal processing device can be also constructed as software, i.e., a program executed on a computer. In this case, the signal processing device is mainly composed of: a central processing unit (CPU); memory to temporarily store such as data being operated; and a file device to store the signal processing program, sampling functions, and the like. The signal processing program provides the procedure for a computer to execute each processing shown in FIG. 1. The signal processing program is available as an independent program that is stored on recording media such as CD-ROM (Compact Disc-Read Only Memory).

Figure 4:
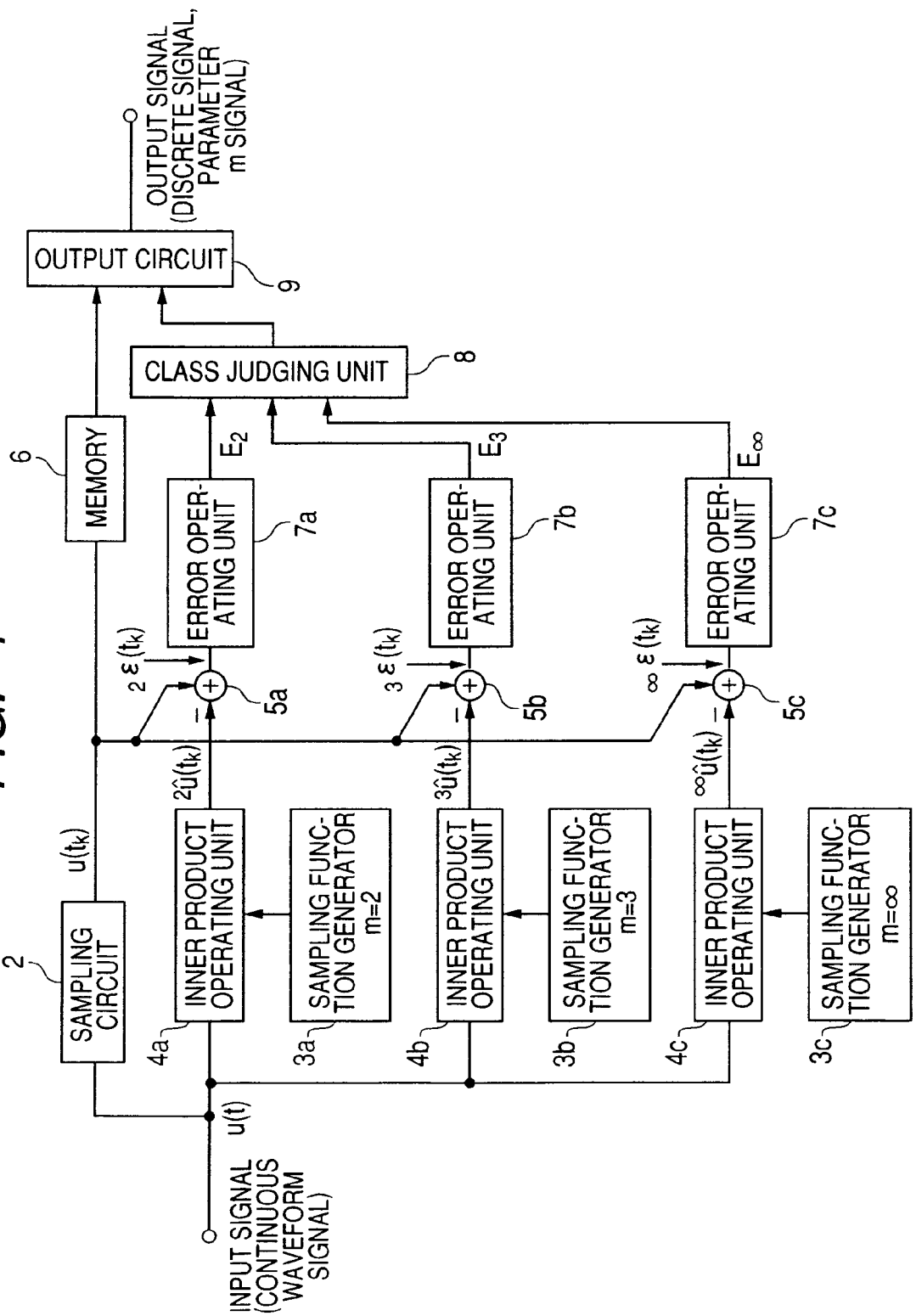
FIG. 4 is a configuration diagram showing a second embodiment of the invention.

The signal processing device can also use an analog signal processing to generate a discrete signal from a continuous waveform signal. FIG. 4 shows a second embodiment of the signal processing device using such analog signal processing. The device components are composed of analog circuits whose functions and operations are the same as those of the corresponding components in FIG. 1. As an exception, the output circuit 9 outputs analog output signals. In this case, the signals may be combined by inserting the parameter m signal into a blanking period of scanning for videos or images. A PCM coder can be used to previously encode and digitize discrete signals and the parameter m signal to be supplied to the output circuit 9. In this case, the output circuit 9 in FIG. 1 is used to supply digital output signals.

Figure 5:
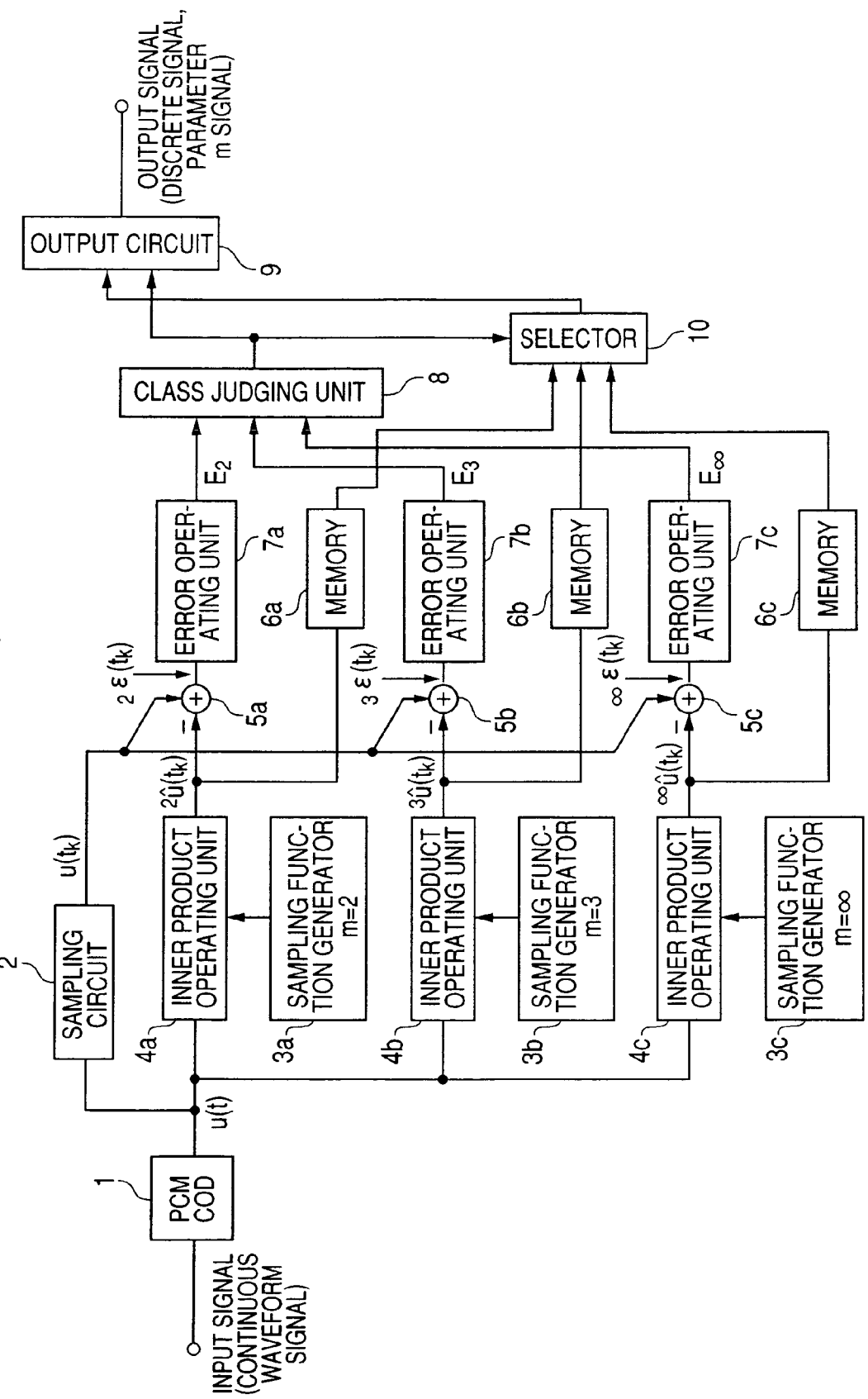
FIG. 5 is a configuration diagram showing a third embodiment of the invention.

According to the first embodiment, the inner product operating unit 4 outputs an inner product operating value for parameter m determined by the class judging unit 8. Since that parameter m matches parameter m of the input signal, the output inner product operating value approximately matches the sampling value of the sampling circuit 2. Accordingly, the inner product operating value can replace the sampling value to be supplied to the output circuit 9. In this case, a selector is provided to select an inner product operating value for the determined parameter m using the parameter m signal output from the class judging unit 8 and supply the output circuit 9 with the selected inner product operating value. FIG. 5 shows a third embodiment that provides the selector. In FIG. 5, reference numeral 10 denotes the selector. In this manner, the signal processing device in FIG. 5 outputs a discrete signal composed of a string of inner product operating values. As mentioned above, the signal processing device in FIG. 1 outputs a discrete signal composed of a string of sampling values. The inner product operating value and the sampling value each are discrete values acquired at every sampling interval. Therefore, the discrete signals can be referred to as a discrete value string.

According to the first embodiment, some input signals may contain a portion where parameter m suddenly changes. When such input signals are processed, it is effective to provide the signal processing device with a circuit to determine a class switching point where parameter m suddenly changes. The signal processing accuracy can be enhanced by reliably locating switching points for parameter m.

Figure 6:
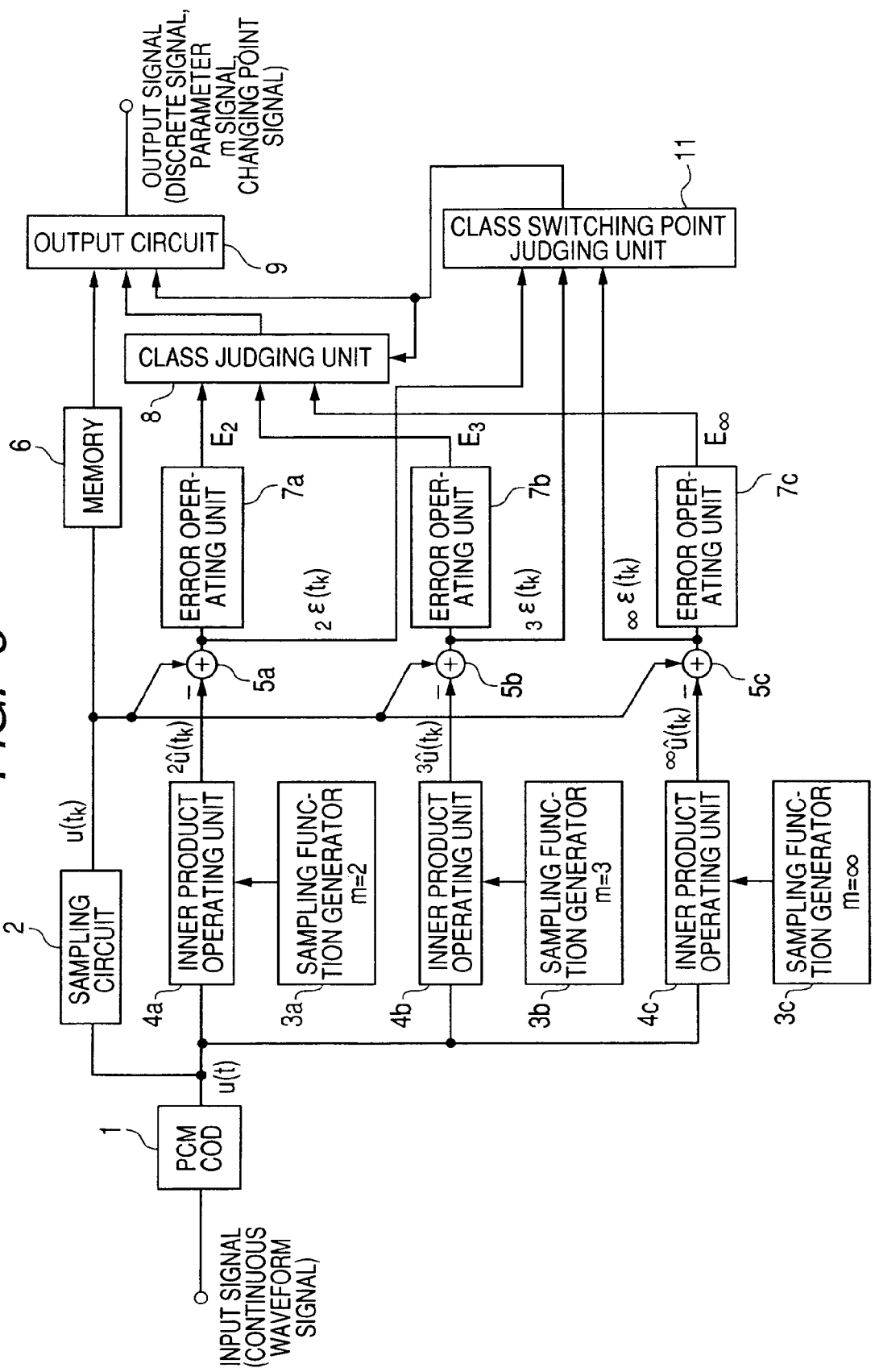
FIG. 6 is a configuration diagram showing a fourth embodiment of the invention.

FIG. 6 shows a fourth embodiment of the signal processing device that is equivalent to the device in FIG. 1 provided with a class switching point judging unit. In FIG. 6, reference numeral 11 denotes a class switching point judging unit to compare errors for m=2, 3, and ∞ from the subtracter 5 with a predetermined threshold value. There may be a case where all errors exceed the threshold value and there is a change in the parameter m signal from the class judging unit 8 near the sampling point. In this case, the class switching point judging unit 11 determines that sampling point to be a class switching point and outputs a switching point signal. The output circuit 9 is supplied with the switching point signal as well as the discrete signal and the parameter m signal and combines these signals to generate a digital output signal. The combination is performed by packetizing the discrete signal and placing the parameter m signal and the switching point signal in the discrete signal's header, for example. The switching point signal only needs to be capable of identifying its presence or absence and therefore can be represented using a 1-bit code, for example. The discrete signal, the parameter m signal, and the switching point signal may be individually output instead of being combined. The circuits other than the class switching point judging unit 11 and the output circuit 9 are the same as those shown in FIG. 1.

The following theoretically describes the principle of operations and processing flows of the signal processing device according to the first through fourth embodiments. The description to follow assumes that parameter m is not limited to m=2, 3, and ∞ but represents multiple parameters in general.

<I> Determining an Optimum Class for an Unknown Signal in a Partial Space of the Fluency Signal Space The following fluency signal space is defined because the fluency function expresses a signal with the length and the phase. It is first clarified to which class of partial signal space in the fluency signal space an unknown class signal belongs. Specifically, the class to which the signal belongs is determined based on a difference between the sampling value of the input signal (original signal) and a value resulting from an inner product operation between the sampling function system and the original signal.

(1) Defining the Fluency Signal Space

The signal space to be discussed hereinafter is assumed to be fluency signal space $^mS(\tau)$, where m=1, 2, ..., and ∞, as a partial space of the representative Hilbert space equation (2) whose inner product is defined by equation (1).

$$<u, v>_{L2} \triangleq \int_{-\infty}^{\infty} u(t)\overline{v(t)} dt \quad (1)$$

$$L_2(R) \triangleq \left\{ u \mid \int_{-\infty}^{\infty} |u(t)|^2 dt < +\infty \right\} \quad (2)$$

Piecewise polynomials are defined by equation (3) and are continuously differentiatable only (m−2) times. Equation (4) defines fluency signal space $^mS(\tau)$ as a signal space, using the function system (a set of functions)

$$\{^m\phi(t-k\tau)\}_{k=-\infty}^{\infty}$$

composed of the piecewise polynomials of degree (m−1) as a base. As mentioned above, τ represents a sampling interval for acquiring a discrete signal (sampling value) from continuous signals. Each sampling point along the time axis is represented as $t_k$ (=kτ).

$$^m\phi(t) \triangleq \int_{-\infty}^{\infty} \left( \frac{\sin \pi f \tau}{\pi f \tau} \right)^m e^{j2\pi ft} df \quad (3)$$

$$^mS(\tau) \triangleq [^m\phi(t-k\tau)]_{k=-\infty}^{\infty} \quad (4)$$

Figure 7:
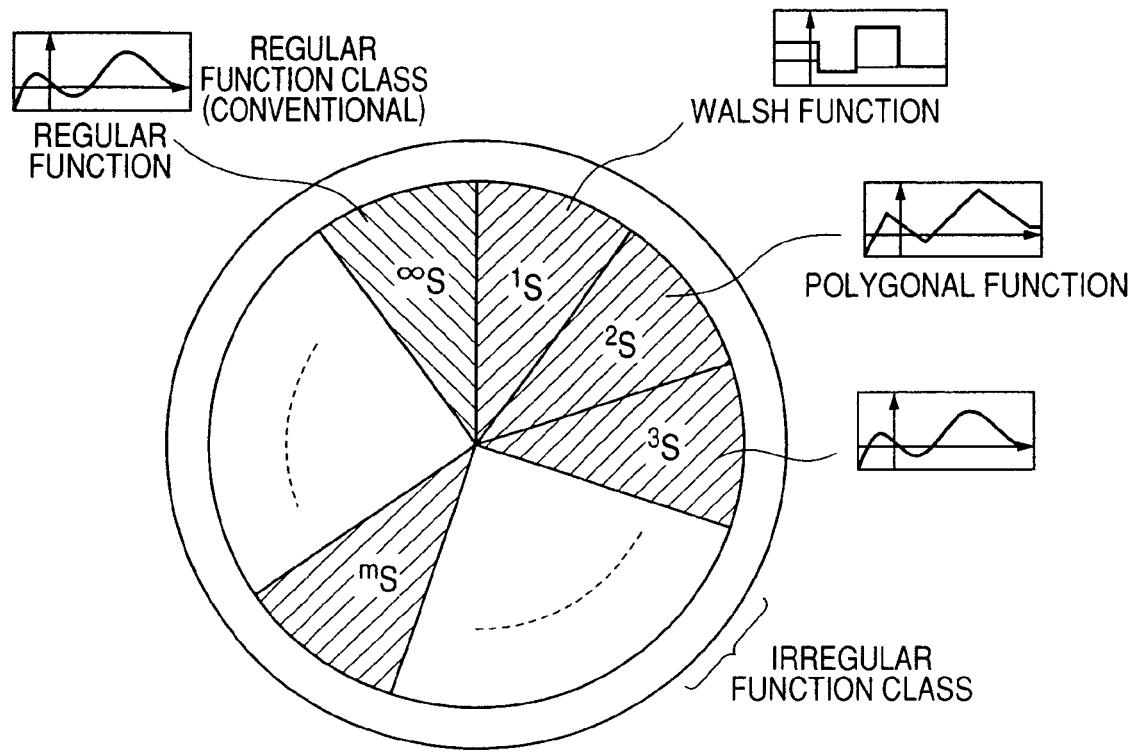
FIG. 7 diagrammatically shows classification of signals according to continuous differentiatability.

When parameter m is 1, fluency signal space $^mS(\tau)$ is categorized as a signal space composed of the Walsh function system. When parameter m is 2, fluency signal space $^mS(\tau)$ is categorized as a signal space composed of a polygonal lines function (polygon). When parameter m is an infinite limit, fluency signal space $^mS(\tau)$ is categorized as a range limit signal space composed of an infinitely continuously differentiatable Sinc function system (regular function system). FIG. 7 is a conceptual diagram of these fluency signal spaces. Signals in the fluency signal space $^mS(\tau)$ are categorized according to the continuous differentiatability.

(2) Meaning of the Sampling Function

Signal space $^mS(\tau)$ is provided with a feature that can acquire the signal's sampling value string $$\{u(t_k)\}_{k=-\infty}^{+\infty}$$

by taking an inner product between a given signal u(t) belonging to mS(□) and the sampling function system belonging to mS(□). The function having this feature is called a sampling function and is expressed as follows.

$$_{[AD]}{}^m\psi(t)$$

The foregoing is expressed by equation (5) to follow.

$$\exists 1_{[AD]}{}^m\psi(t) \in {}^mS, \forall u(t) \in {}^mS, \forall k \in Z, <u(t), {}_{[AD]}{}^m\psi(t-t_k)> = u(t_k) \quad (5)$$

In equation (5), the symbol
"∃1"
signifies the sole existence. The symbol
"∀"
signifies an arbitrary element. The symbol
"Z"
signifies a set of whole integers.

(3) Using the Sampling Function to Specify a Class of Partial Signal Space to which an Unknown Signal Belongs It is assumed that $^mu(t)$ represents a signal belonging to signal space $^mS(\tau)$. The following determines to which class of signals in fluency signal space $^mS(\tau)$ an unknown class signal u(t) belongs.

When there are plural signals $^1u(t), ^2u(t), \ldots, ^lu(t), \ldots$, and $^\infty u(t)$, the following equation expresses a fluency signal space for $m_0$ out of plural m=1, 2, ..., $m_0$, ..., and ∞.

$$^{m_0}S(\tau)$$

The sampling function system belonging to this fluency signal space is expressed as follows.

$$_{[AD]}{}^{m_0}\psi(t-t_k)$$

Let us take an inner product between the signals and the sampling function system.

(i) l=$m_0$, there is $m_0$ that satisfies relational expression (6).

$$\forall k \in Z, <{}^lu(t), {}_{[AD]}{}^{m_0}\psi(t-t_k)> = {}^lu(t_k) \quad (6)$$

(ii) When l≠$m_0$, there is $m_0$ that satisfies relational expression (7).

$$\exists k \in Z, <{}^lu(t), {}_{[AD]}{}^{m_0}\psi(t-t_k)> \neq {}^lu(t_k) \quad (7)$$

Using this relation, the class for a given unknown class signal u(t) can be specified as an element of the following.

$$^{m_0}S(\tau)$$

Figure 8:
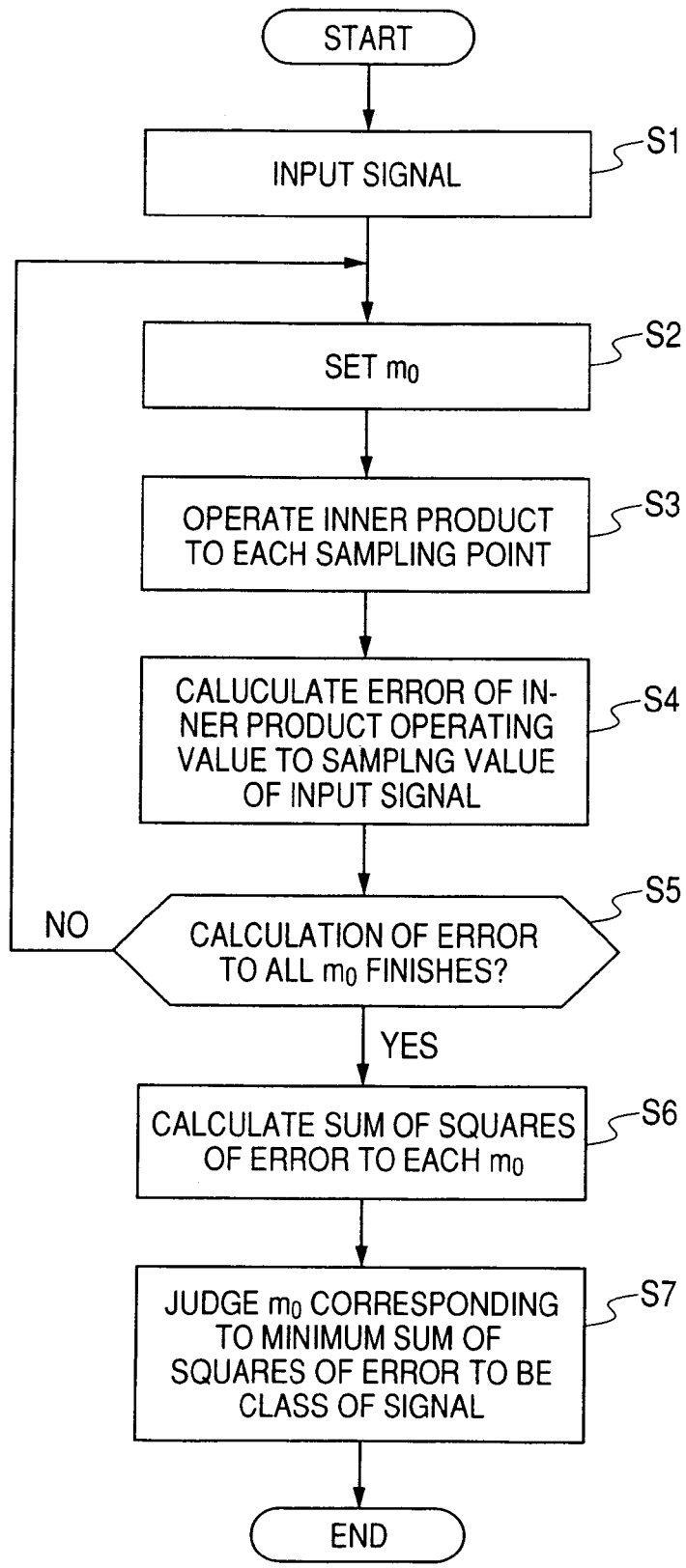
FIG. 8 is a flowchart showing a processing to specify a class to which a signal belongs.

Referring now to FIG. 8, the following describes a processing procedure to determine the class based on the above-mentioned principle.

A signal is input (Step S1). One $m_0$ is selected (Step S2). The following sampling function is defined for each of sampling points $t_k, t_{k+1}, \ldots,$ and $t_{k+(J-2)}$ within the span 0 to (J−1)τ.

$$_{[AD]}{}^{m_0}\psi(t-t_k)$$

where k=k, k+1, ..., and k+(J−2).

The processing calculates an inner product between the sampling point and input signal u(t) for the span 0 to (J−1)τ (Step S3). Equation (8) to follow expresses the value resulting from this operation.

$$^{m_0}\hat{u}(t_k) = <u, {}_{AD}{}^{m_0}\psi(t-t_k)> \quad (8)$$

This is referred to as an inner product operating value.

The processing then calculates an absolute value for a difference between the input signal for the inner product operating value acquired at Step S3 and sampling value u(tk) (Step S4). The absolute value is expressed by equation (9) as follows.

$$_{m_0}\epsilon(t_k)=|u(t_k)-{}^{m_0}\hat{u}(t_k)| \quad (9)$$

The processing at Steps S2 to S4 is repeated by changing m0 (Step S5) to calculate a difference for each $m_0$.

The processing calculates a sum of squares for the differences found at Step S4 for each m0 (Step S6). The calculation is expressed by equation (10) as follows.

$$E_{m_0} = \sum_{p=0}^{N-1} {}_{m_0}\varepsilon^2(t_{k+p}) \quad (10)$$

The error operation may be an arithmetic sum of absolute values for the differences depending on signal properties. In this case, the following equation (11) is used.

$$E_{m_0} = \sum_{p=0}^{N-1} {}_{m_0}\varepsilon(t_{k+p}) \quad (11)$$

Alternatively, the error operation may select the maximum of absolute values for the differences. In this case, the following equation (12) is used.

$$E_{m_0} = \text{MAX}_{p=0}^{N-1} {}_{m_0}\epsilon(t_{k+p}) \quad (12)$$

The following expresses the minimum in the sum of squares found by equation (10).

$$\min_{m_0} E_{m_0}$$

The processing specifies m0 in this equation to be the class to which signal u(t) belongs (Step S7).

Figure 9:
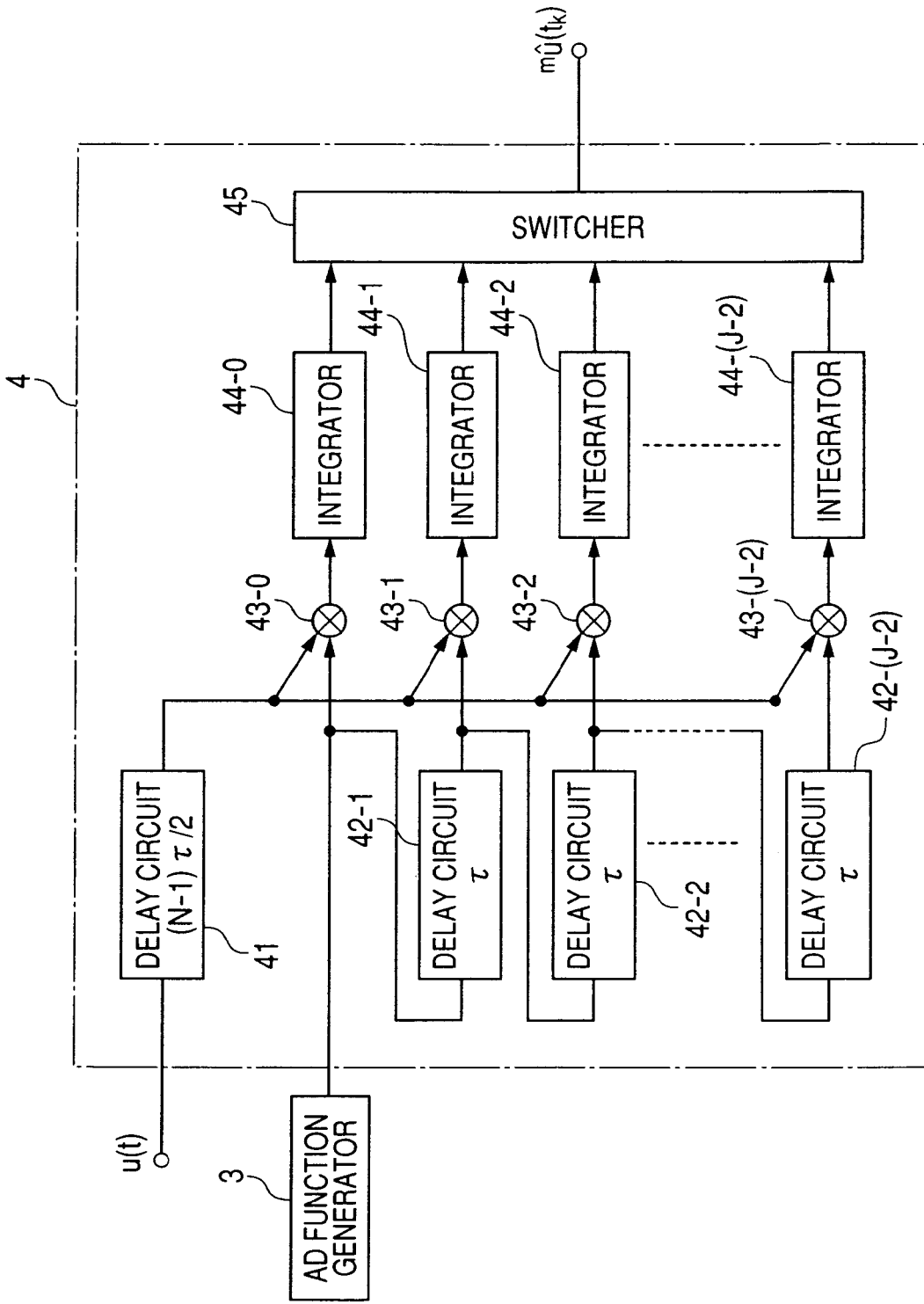
FIG. 9 is a configuration diagram showing an inner product operating unit in FIG. 1.

FIG. 9 is used to describe an example of the inner product operating unit 4 in FIG. 1 constructed according to the above-mentioned theory. The inner product is equivalent to integrating a product between the input signal and the sampling function within the span 0 to (J−1)τ at sampling point t=$t_k$. When the time point to start the sampling function is selected as an origin, the time for the delayed input signal can be aligned to the time for the sampling function by delaying the input signal for (J−1)τ/2. The processing then operates an inner product between the sampling function and the delayed input signal by delaying the sampling function for τ. This makes it possible to yield the following inner product operating values corresponding to the sampling points $t_k$, $t_{k+1}$, ..., and $t_{k+(J-2)}$ at an interval of τ

$${}^{m_0}\hat{u}(t_k)$$

where k=k, k+1, ..., and k+(J−2).

The processing starts generating the sampling function from the next sampling point $t_{k+(J-1)}$ and performs the similar operations.

As shown in FIG. 9, the inner product operating unit 4 for parameter m is composed of: a delay circuit 41 to delay input signal u(t) by (J−1)τ/2; delay circuits 42-1 through 42-(J−2) for the number of (J−2) to delay the sampling function by τ; multipliers 43-0 through 43-(J−2) for the number of (J−1) to multiply a delayed input signal by the sampling function; integrators 44-0 through 44-(J−1) for the number of (J−1) to integrate an output signal from the multiplier 43; and a switcher 45 to switch output signals from the integrator 44 in the order of 0 to (J−2) for output.

<II> Detecting a Class Switching Point

It is assumed that a given signal is represented by a linkage of signals having different classes. Such signal has points (class switching points) as boundaries for the signals having different classes. An inner product is taken between the sampling function system and the original signal (input signal) to yield an inner product operating value. The class switching point is detected based on an error between the inner product operating value and the sampling value for the input signal.

(1) Defining and Classifying Class Switching Points

With reference to a given point on one signal, the original signal may be represented by signals having different classes in the domains before and after that point. For example, in domain A, the signal is represented as a signal for class mA, i.e., $${}^{m_A}S$$

In domain B, the signal is represented as a signal for class mB, i.e., $${}^{m_B}S$$

In such case, there is a boundary linking signals having different classes. The boundary is called a class switching point and is represented as P(mA, mB). The class switching points contain a peculiar point (undifferentiatable point), called an ultra peculiar point.

The class switching point P($m_A$, $m_B$) is classified into two categories according to properties at that point as follows.

Figure 10:
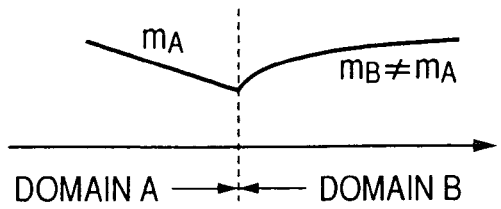
FIG. 10 is a first diagram showing a class switching point.

(i) The point P($m_A$, $m_B$) makes the signal continuous but undifferentiatable and satisfies the condition $m_A \neq m_B$. FIG. 10 exemplifies such class switching point as the ultra peculiar point.

Figure 11:
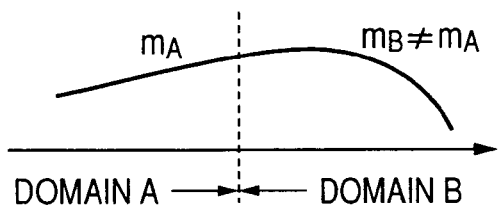
FIG. 11 is a second diagram showing a class switching point.

(ii) The point P($m_A$, $m_B$) makes the signal continuous and differentiatable and satisfies the condition $m_A \neq m_B$. FIG. 11 exemplifies such class switching point.

Figure 12:
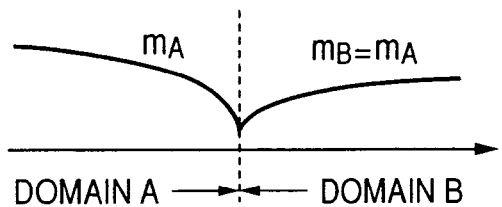
FIG. 12 is a third diagram showing a class switching point.

The point P($m_A$, $m_B$) may contain a case where m is unchanged but undifferentiatable and satisfies the condition $m_A = m_B \geq 3$. FIG. 12 exemplifies such point called a peculiar point that is not a class switching point. There may be a case where an unknown signal is represented as a signal belonging to the class m=1 (step) or m=2 (polygonal line). The signal may contain discontinuous points and continuous but undifferentiatable points (connections between polygonal lines) that are not targeted for detection according to the invention.

(2) Detecting a Class Switching Point

Figure 13:
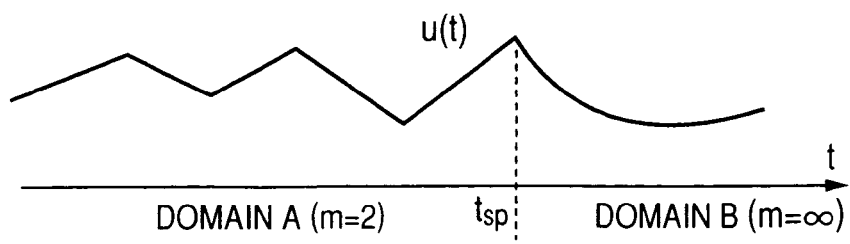
FIG. 13 is a fourth diagram showing a class switching point.

The following describes detection of a class switching point with reference to FIG. 13 (specifically detection of an ultra peculiar point) as an example. As shown in FIG. 13, it is assumed that signal u(t) is represented as a signal (polygon or polygonal line) belonging to the class m=2 in a given span (domain A). Further, it is assumed that signal u(t) is represented as a signal belonging to the class m=∞ at the boundary t=tsp and in the subsequent span (domain B). Moreover, it is assumed that there is another signal class m=3.

(i) In domain A, an inner product operating value is acquired by taking an inner product between the sampling function $$_{[AD]}{}^{m_0}\psi(t)$$

for class m0 and signal u(t). The calculation is performed to find an error (represented as $${}_{m_0}\epsilon(A)$$

$m_0=2$, 3, and $\infty$. Out of errors $_2\epsilon(A)$, $_3\epsilon(A)$, and $_\infty\epsilon(A)$, $_2\epsilon(A)$ becomes the minimum.

(ii) Similarly, in domain B, errors $_2\epsilon(B)$, $_3\epsilon(B)$, and $_\infty\epsilon(B)$ are acquired. Of these, $_\infty\epsilon(B)$ becomes the minimum.

(iii) Errors $_2\epsilon(t_{sp})$, $_3\epsilon(t_{sp})$, and $_\infty\epsilon(t_{sp})$ are found in the vicinity of ultra peculiar point $t=t_{sp}$ where the class switches. Values $_2\epsilon$, $_3\epsilon$, and $_\infty\epsilon$ all become large, making it difficult to clearly specify a class. Based on this information, the class switching point is positioned.

Figure 14:
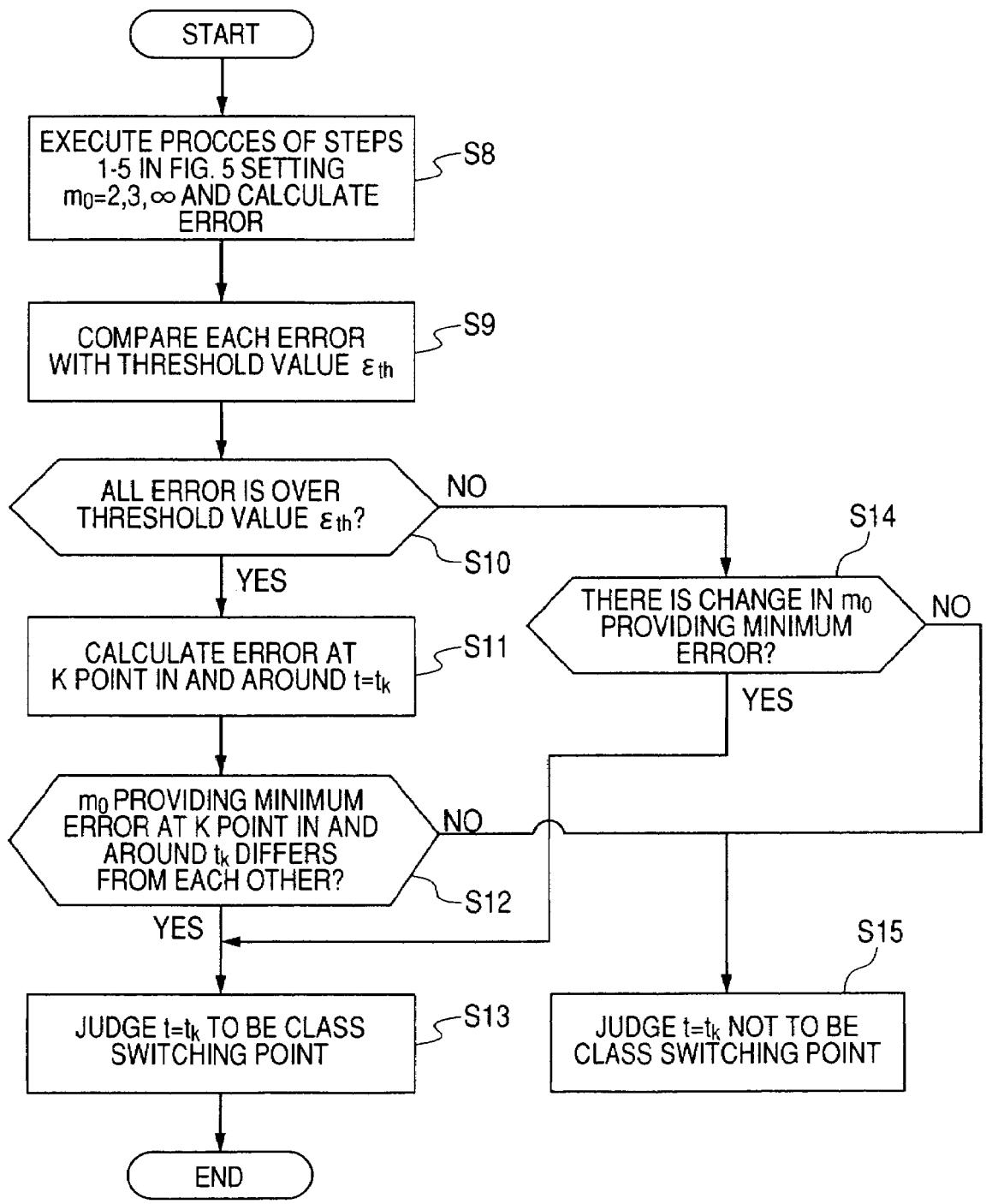
FIG. 14 is a flowchart showing a processing to detect a class switching point.

With reference to FIG. 14, the following describes a class determination processing procedure based on the above-mentioned principle. As mentioned above, the description concerns the example where the sampling function is applicable to the classes $m_0=2$, 3, and $\infty$.

At each of sampling points tk, tk+1, ..., and tk+(J−2), the processing takes an inner product between input signal u(t) and the sampling function $$_{[AD]}{}^{m_0}\psi(t)$$

to find an inner product operating value $$^{m_0}\hat{u}(t_k)$$

where k=k, k+1, ..., and k+(J−2). The processing then calculates an error $$_{m_0}\epsilon(t_k)$$

between the calculated inner product operating value and the sampling value u(tk) for the input signal (Step S8). So far, the processing is the same as that at Steps S1 through S5 in FIG. 8 based on m0=2, 3, and $\infty$.

The processing compares errors $_2\epsilon(t_k)$, $_3\epsilon(t_k)$, and $_\infty\epsilon(t_k)$ corresponding to $m_0$ with predetermined threshold value $\epsilon_{th}$ (Step S9). When all the errors are greater than or equal to threshold value $\epsilon_{th}$ (Step S10), the processing further calculates the error of points K before and after $t=t_k$ (Step S11). It may be determined that, in the range k−K≧n<k, the error $$_{m_1}\epsilon(t_n)$$

corresponding to m1 is smaller than errors for the other classes and is therefore the minimum and that, in the other range k<n≦k+K, the error $$_{m_2}\epsilon(t_n)$$

corresponding to $m_2 \neq m_1$ is smaller than errors for the other classes and is therefore the minimum (Step S12). In this case, the processing assumes the point for t=tk to be the ultra peculiar point, i.e., the class switching point (Step S13).

When the processing determines at Step S10 that all errors are not greater than or equal to threshold value $\epsilon_{th}$ and at least one error is smaller than or equal to $\epsilon_{th}$, a change may be detected in parameter m0 that gives a minimum error at a given point (Step S14). The processing assumes that changing point to be the class switching point. When no change is detected in parameter m0, the processing determines that there is no class switching point (Step S15). When the processing determines at Step S12 that no change is detected in parameter m0 giving a minimum error and that the condition $m_2=m_1$ is satisfied, the processing determines that there is no class switching point (Step S15).

As mentioned above, the first through third embodiments provide the signal processing to acquire a discrete signal from the input signal as the continuous waveform signal. The signal processing makes it possible to clarify the class to which the input signal to be processed belongs and acquire the parameter m signal indicating the class as well as a discrete signal (discrete value string). The fourth embodiment makes it possible to acquire the switching point signal indicating the class switching point corresponding to input signals.

The above-mentioned parameter m signal may be used to select the inverse sampling function for parameter m in the signal processing to generate a continuous waveform signal from a discrete signal. In this manner, the continuous waveform signal can be generated using the inverse sampling function corresponding to parameter m to which the discrete signal belongs. Consequently, it is possible to reproduce high-quality continuous waveform signals independently of band limitations according to the Shannon's sampling theorem.

As mentioned above, the signal processing device according to the invention is supplied with a discrete signal acquired from a continuous waveform signal based on the fluency information theory and generates a continuous waveform signal from the discrete signal using the inverse sampling function. The following describes the signal processing device according to the invention.

Figure 15:
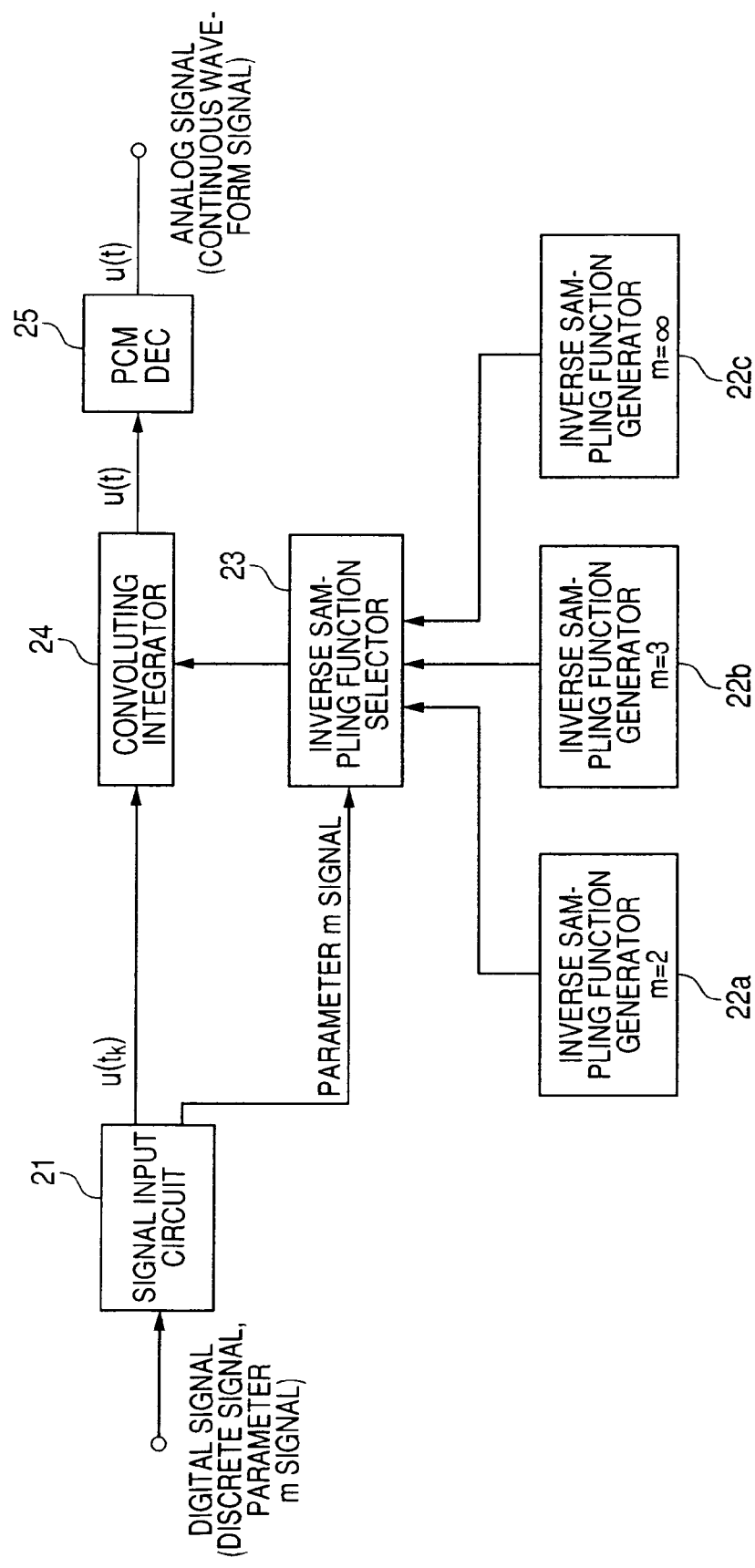
FIG. 15 is a configuration diagram showing a fifth embodiment of the invention.

FIG. 15 shows a fifth embodiment of the signal processing device according to the invention. The signal processing device according to this embodiment is supplied with a digital output signal output from the signal processing device according to the first embodiment as shown in FIG. 1, for example. The digital signal processing is performed to acquire the continuous waveform signal from a discrete signal.

Figure 17:
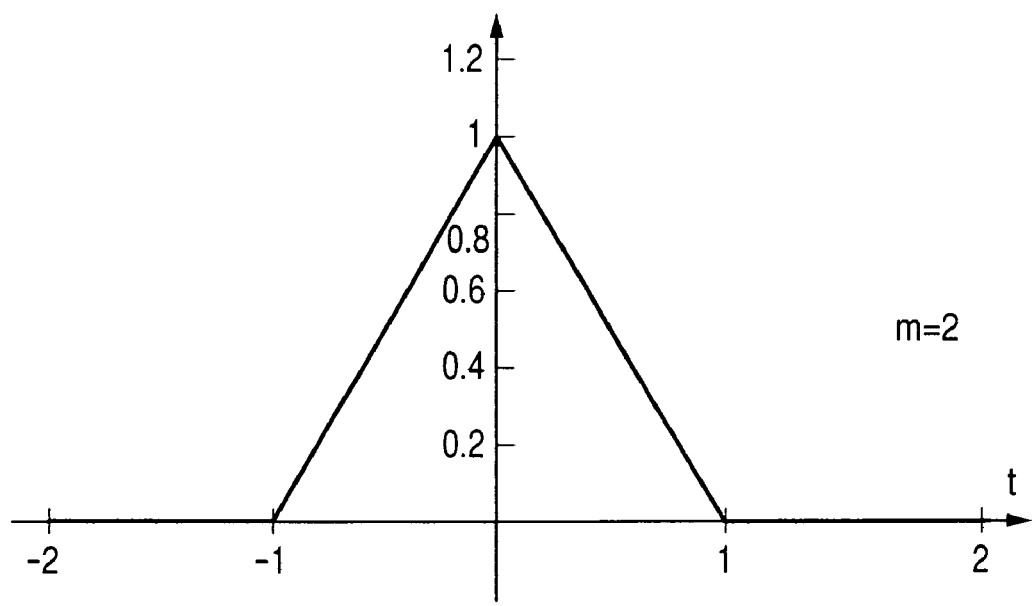
FIG. 17 is a graph exemplifying the sampling function with m=2.
Figure 18:
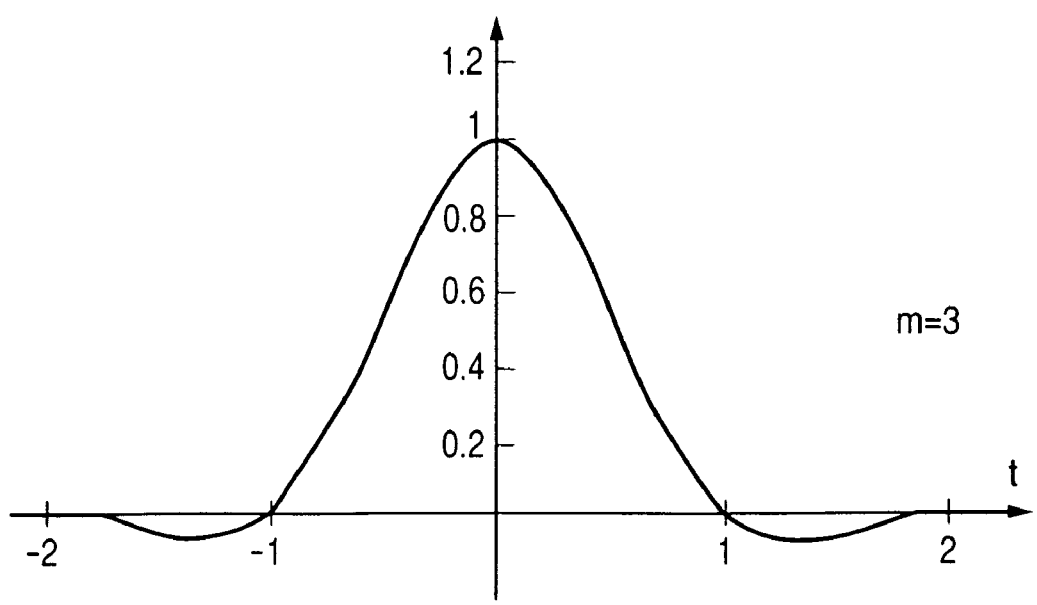
FIG. 18 is a graph exemplifying the sampling function with m=3.

The inverse sampling function used for the signal processing is biorthogonal to the above-mentioned sampling function that is used for the signal processing device according to the first embodiment. FIGS. 17 and 18 show function examples under the conditions of m=2 and 3. The inverse sampling function with m=2 and 3 is settled within the finite span 0 to (P−1)τ. The convoluting integration is performed at each sampling point within this span. When m is 3, P is typically set to 5. The inverse sampling function with m=∞ infinitely continues oscillation. Accordingly, the device limits the span for this function to the same span for the function with m=2 or 3. A resulting slight error is allowable. To increase the processing accuracy for m=∞, the range of convolution integration can be wider than the above-mentioned one.

In FIG. 15, reference numeral 21 denotes a signal input circuit that is supplied with a digital signal composed of a discrete signal of an original signal belonging to parameter m and a parameter m signal indicating the parameter m and separates these signals from each other and outputs them; 22 denotes an inverse sampling function generator that generates an inverse sampling function for each of parameters m; 23 denotes an inverse sampling function selector that selects an inverse sampling function with parameter m corresponding to the discrete signal out of inverse sampling functions with each of parameters m output from the inverse sampling function generator 22; 24 denotes a convoluting integrator that acquires a continuous waveform signal by performing convolution integration between the discrete signal from the signal input circuit 21 and the inverse sampling function selected by the inverse sampling function selector 23; and 25 denotes a PCM decoder (PCMDEC) that outputs an analog signal equivalent to the continuous waveform signal output from the convoluting integrator 24. The inverse sampling functions for m=2, 3, and ∞ output from the inverse sampling function generator 22 are previously stored in a data file (not shown) of a storage device and are read each time a function is selected.

Let us suppose that the inverse sampling function with parameter m is expressed as follows.

$$_{[DA]}{}^{m}\psi(t)$$

As mentioned above, the inverse sampling function and the sampling function are associated with each other so as to be biorthogonal. In particular, the inverse sampling function is configured to be set to a given value at a targeted sampling point and reset to 0 at the other sampling points.

Equation (13) to follow expresses the convolution integration for DA operations.

$$\sum_{k=-\infty}^{k=\infty} u(t_k)_{[DA]}^m \psi(t-t_k) \quad (13)$$

Operating equation (13) can yield continuous waveform signal u(t) that reproduces the original signal.

Accordingly, a sampling value for sampling point $t_k$ is held for (P−1)τ from t=$t_k$. The held signal is multiplied by the inverse sampling function that starts being generated from t=$t_k$. The operation is performed as often as (P−2) times put off for a sampling interval of τ. The resulting products are added accumulatively in succession. The same operation is repeated from the next sampling point $t_{k+(p-1)}$ to operate the convolution integration and acquire continuous waveform signal u(t). Such processing to acquire a continuous waveform signal from discrete signals smoothly connects between each of discrete values using the DA function (inverse sampling function) with parameter m. The processing can be defined as an interpolation or a processing treatment to acquire a continuous signal.

Figure 16:
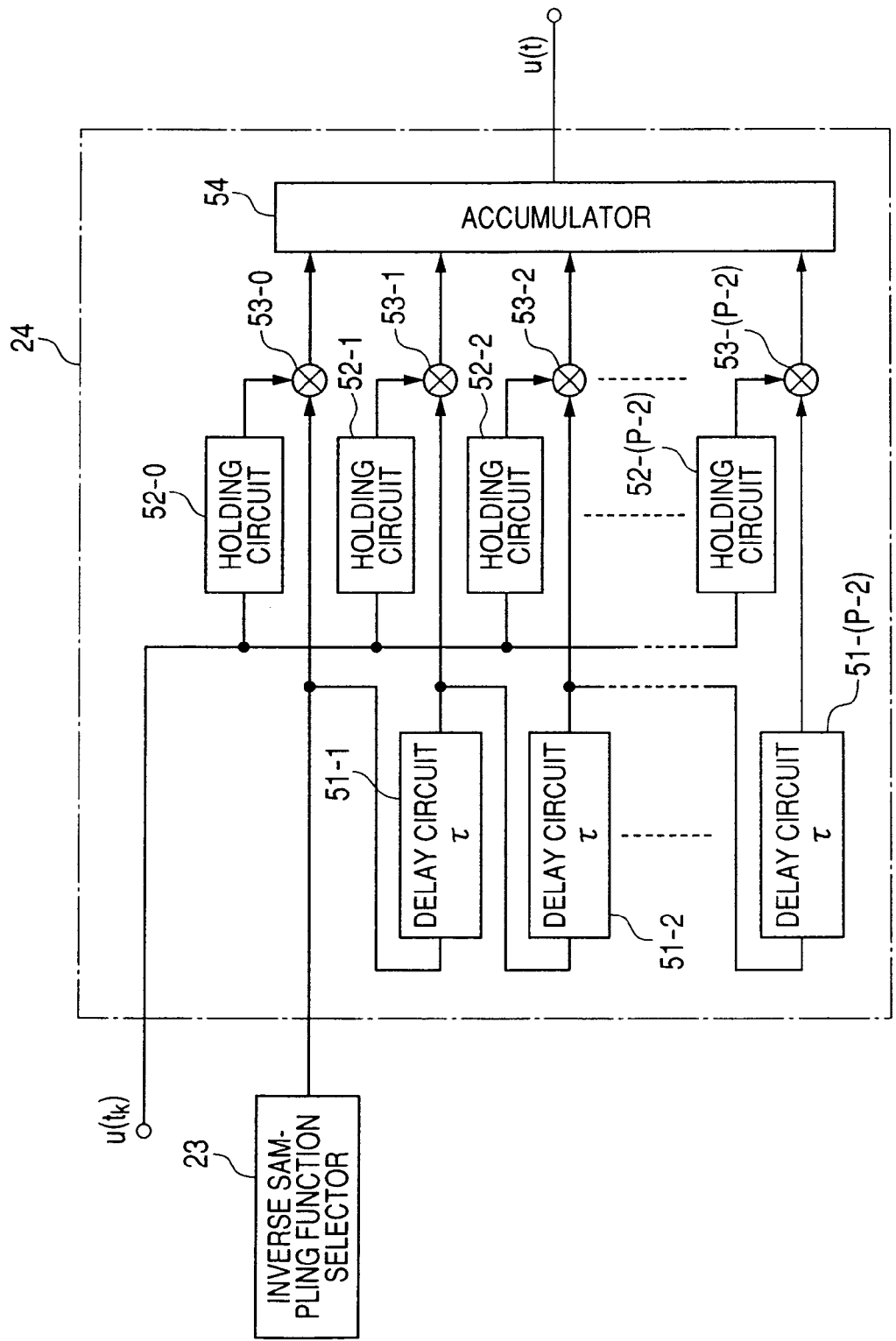
FIG. 16 is a configuration diagram exemplifying a convoluting integrator.

In consideration for this, for example, the convoluting integrator 24 in FIG. 15 can be constructed as shown in FIG. 16. That is, the convoluting integrator 24 is composed of: delay circuits 51-1 through 51-(P−2) as many as (P−2) to delay the inverse sampling function by τ; holding circuits 52-0 through 52-(P−2) as many as (P−1) to hold sampling values for sampling points $t_k$, $t_{k+1}$, ..., and $t_{k+(P-b\ 2)}$ at interval τ; multipliers 53-0 through 53-(P−2) as many as (P−1) to multiply a holding signal output from the holding circuit 52 by the inverse sampling function; and an accumulator 54 to accumulatively add output signals from the multiplier 53 in the order of output.

Similarly to the first embodiment, the signal processing device according to the embodiment can be constructed as hardware using digital circuits and memory for the corresponding components. The signal processing device can be also constructed as software, i.e., a program executed on a computer. In this case, the signal processing device is mainly composed of: a central processing unit (CPU); memory to temporarily store data being operated; and a file device to store the signal processing program, sampling functions, and the like. The signal processing program provides the procedure for a computer to execute the processing shown in FIG. 15. The signal processing program is available as an independent program that is stored on recording media such as CD-ROM (Compact Disc-Read Only Memory).

As mentioned above, the embodiment enables the signal processing using the inverse sampling functions appropriated to classes, making it possible to acquire high-quality reproduction signals.

The input signal according to the embodiment may be a digital signal output from the signal processing device according to the third embodiment as shown in FIG. 5. The same continuous waveform signal (reproduction signal) can be acquired.

Figure 19:
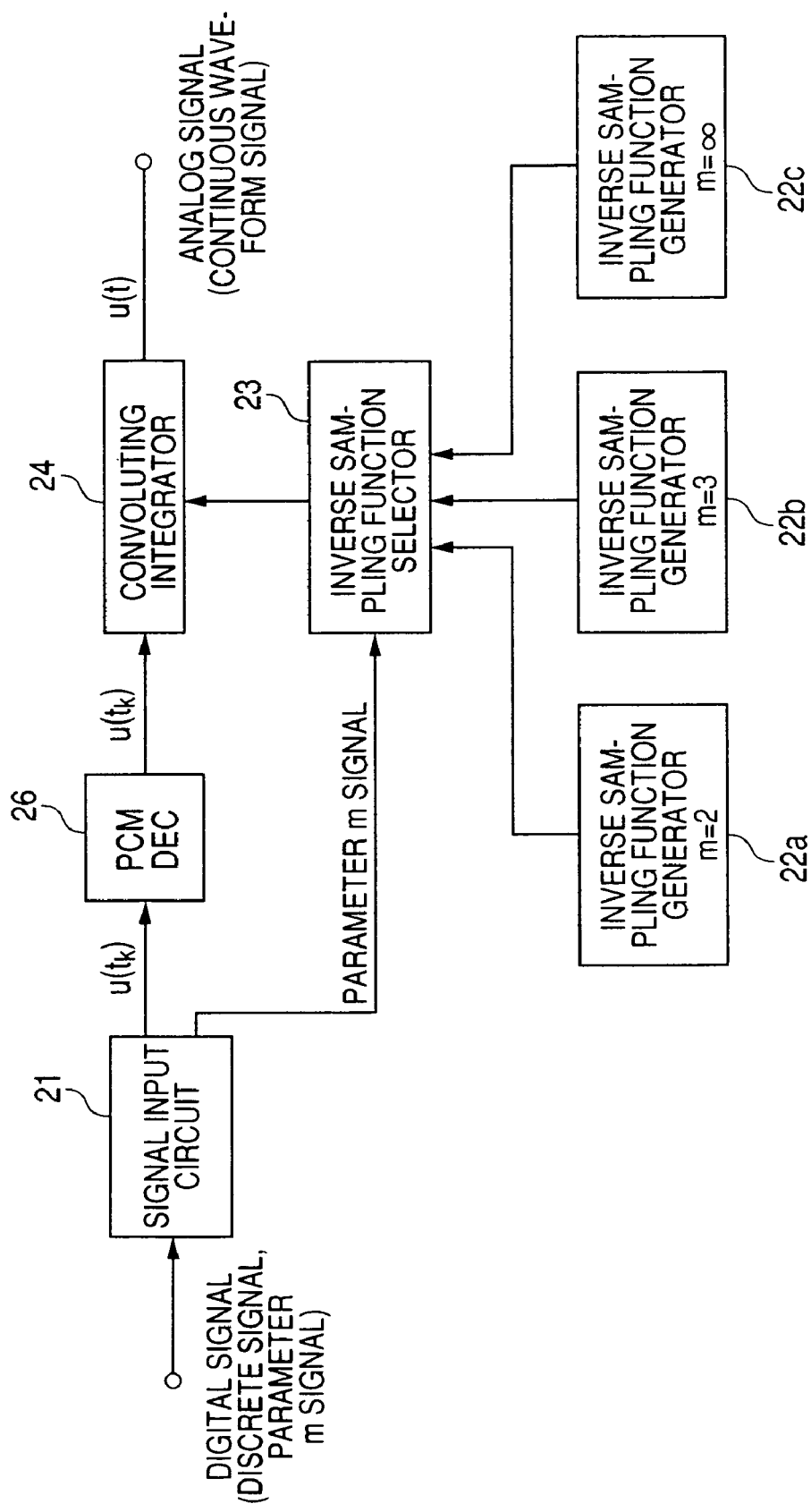
FIG. 19 is a configuration diagram showing a sixth embodiment of the invention.

While the embodiment disposes the PCM decoder 25 at the output side, it can be disposed at the input side. Such construction is shown as a sixth embodiment of the invention in FIG. 19. In FIG. 19, the PCM decoder 26 converts a digital discrete signal into an analog discrete signal. In FIG. 19, the inverse sampling function generator 22, the inverse sampling function selector 23, and the convoluting integrator 24 have the same functions as those shown in FIG. 15, but are constructed as analog circuits.

Figure 20:
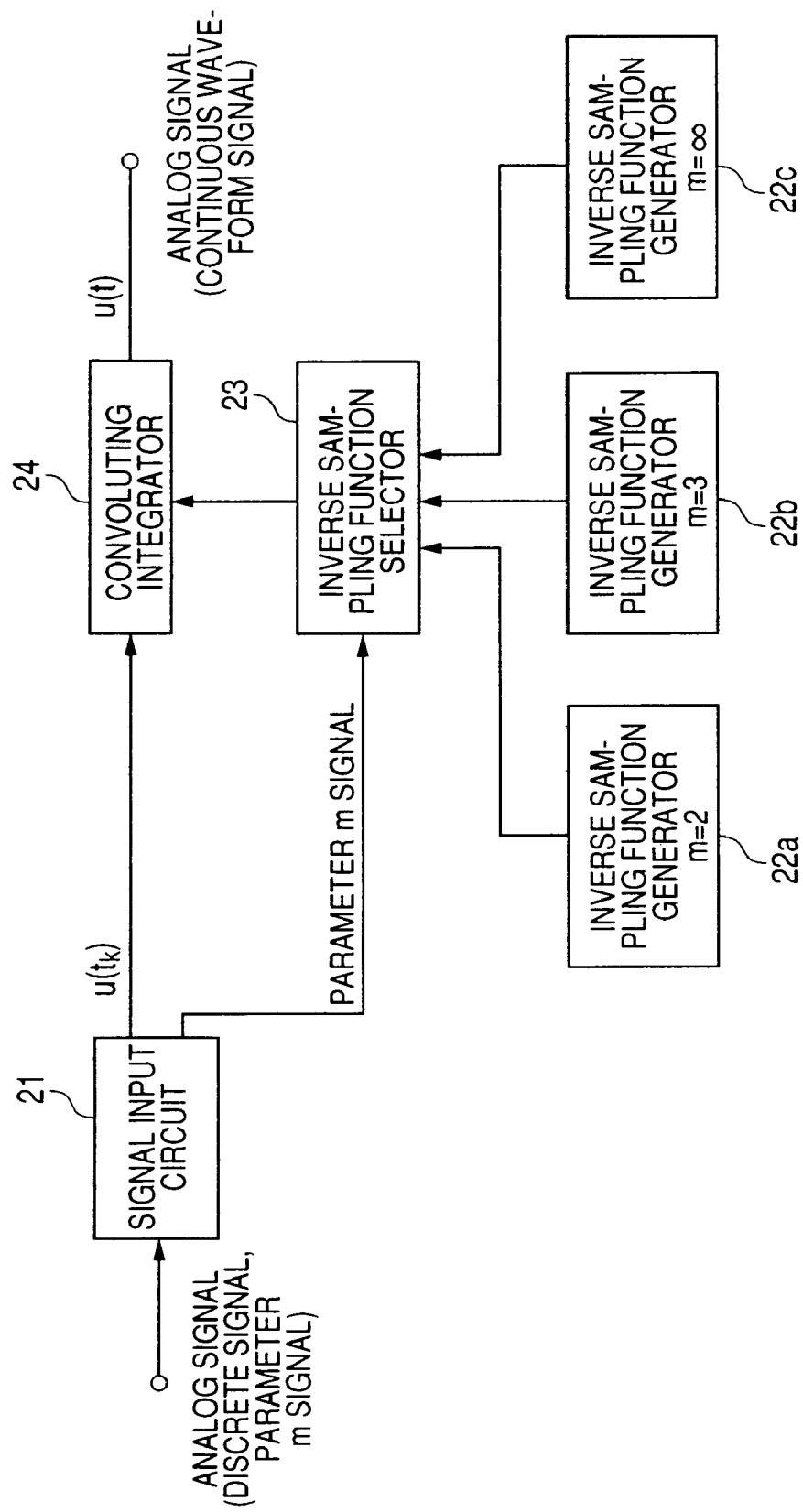
FIG. 20 is a configuration diagram showing a seventh embodiment of the invention.

FIG. 20 shows a seventh embodiment of the invention for supplying analog signals. For example, the input signal is an analog signal output from the signal processing device according to the second embodiment shown in FIG. 4 and is composed of a discrete signal and a parameter m signal combined with each other. The signal input circuit 27 in FIG. 20 separates the combination of the discrete signal and the parameter m signal from each other. Similarly to the sixth embodiment, analog circuits are used for the inverse sampling function generator 22, the inverse sampling function selector 23, and the convoluting integrator 24.

Figure 21:
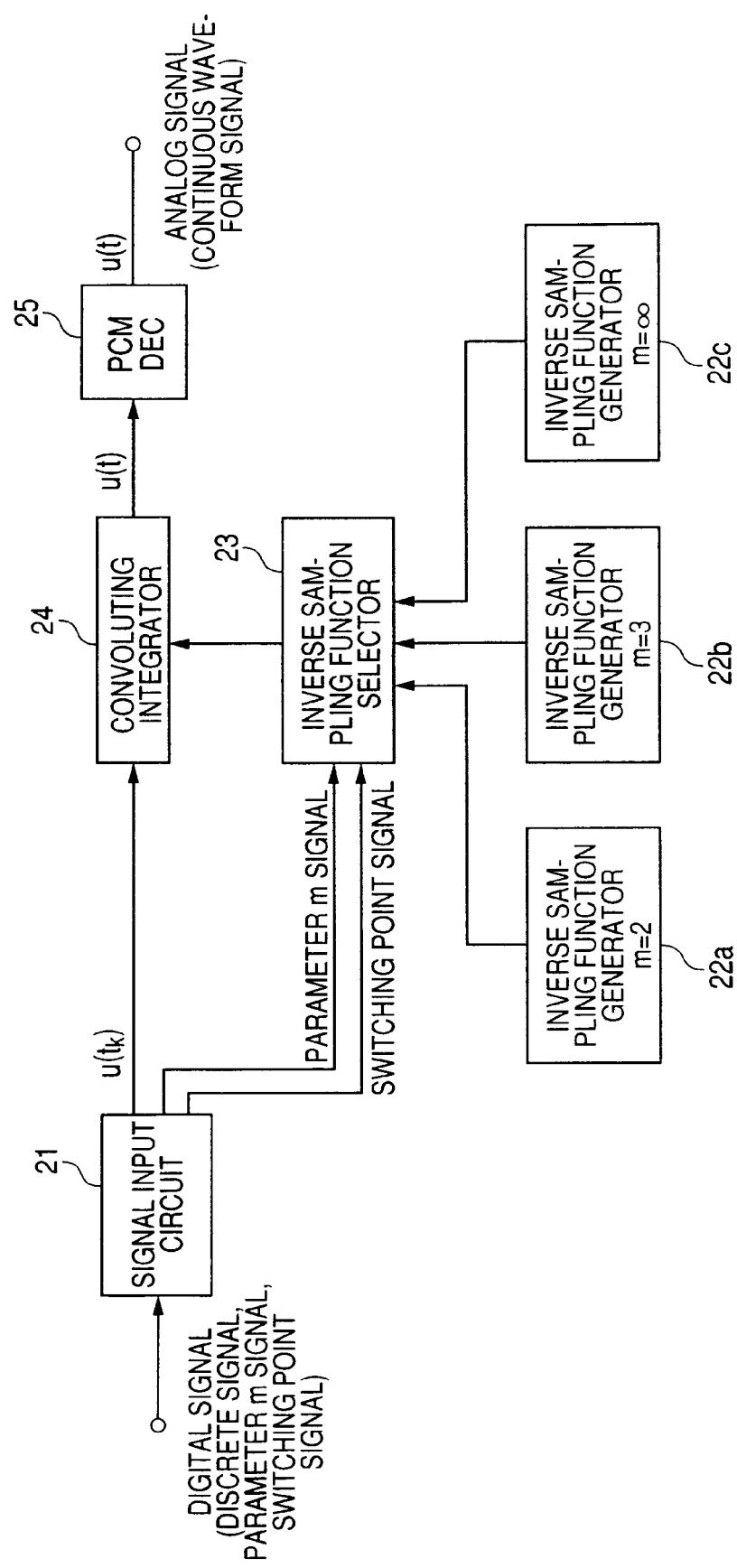
FIG. 21 is a configuration diagram showing an eighth embodiment of the invention.

FIG. 21 shows an eighth embodiment of the invention for supplying a signal composed of the discrete signal and the parameter m signal provided with a switching point signal. The input signal is a digital signal output from the signal processing device according to the fourth embodiment as shown in FIG. 6, for example. The signal input circuit in FIG. 21 separates the combination of the discrete signal, the parameter m signal, and the switching point signal from each other. The inverse sampling function selector 23 uses the parameter m signal and the switching point signal as selection control signals. When the switching point signal arrives, the inverse sampling function selector 23 changes the class and uses the parameter m signal to determine parameter m for the class to be changed. In this manner, the inverse sampling function selector 23 selects the inverse sampling function for the determined parameter m. The inverse sampling function 22, the convoluting integrator 24, and the PCM decoder 25 are the same as those for the fifth embodiment.

Obviously, the PCM decoder 25 can be disposed between the input signal circuit 21 and the convoluting integrator 24. Similarly to the sixth embodiment, analog circuits can be used for the inverse sampling function generator 22, the inverse sampling function selector 23, and the convoluting integrator 24.

The signal processing devices according to the first, third, and fourth embodiments (FIGS. 1, 5, and 6) and the signal processing device provided with the PCM coder at the output side according to the second embodiment are supplied with analog continuous waveform signals and output digital discrete signals (discrete value strings). The signal processing devices according to the first, third, and fourth embodiments can be interpreted as an AD converter. Similarly, the signal processing devices according to the fifth, sixth, and eighth embodiments can be interpreted as a DA converter that is supplied with a digital discrete signal and outputs an analog continuous waveform signal. When both devices construct an A-D/D-A conversion system, both devices may be directly connected or may be connected via a transmission system or a recording system. When data passes through the transmission system or the recording system, information compression coding or transmission path coding may be provided to decrease the amount of data. In this case, data passes through the transmission system or the recording system, and then is decoded and D-A converted.

When the transmission system is a communication system, it is available as internet, cellular phone networks, and cable television, or ground-based broadcasting and satellite broadcasting using radio waves. The recording system can provide recording media such as CD (Compact Disc) and DVD (Digital Versatile Disc). Through the use of these technologies, it is expected to provide higher-precision video than ever before. When it is enough to provide the same reproduction quality as before, it is possible to narrow the communication system's transmission band and extend the recording time on CD and DVD.

When the A-D/D-A conversion system is applied to a print system, the system can provide much higher-precision images than ever before. Even when an image is enlarged or reduced, it is expected to maintain high quality or provide high scalability.

Figure 22:
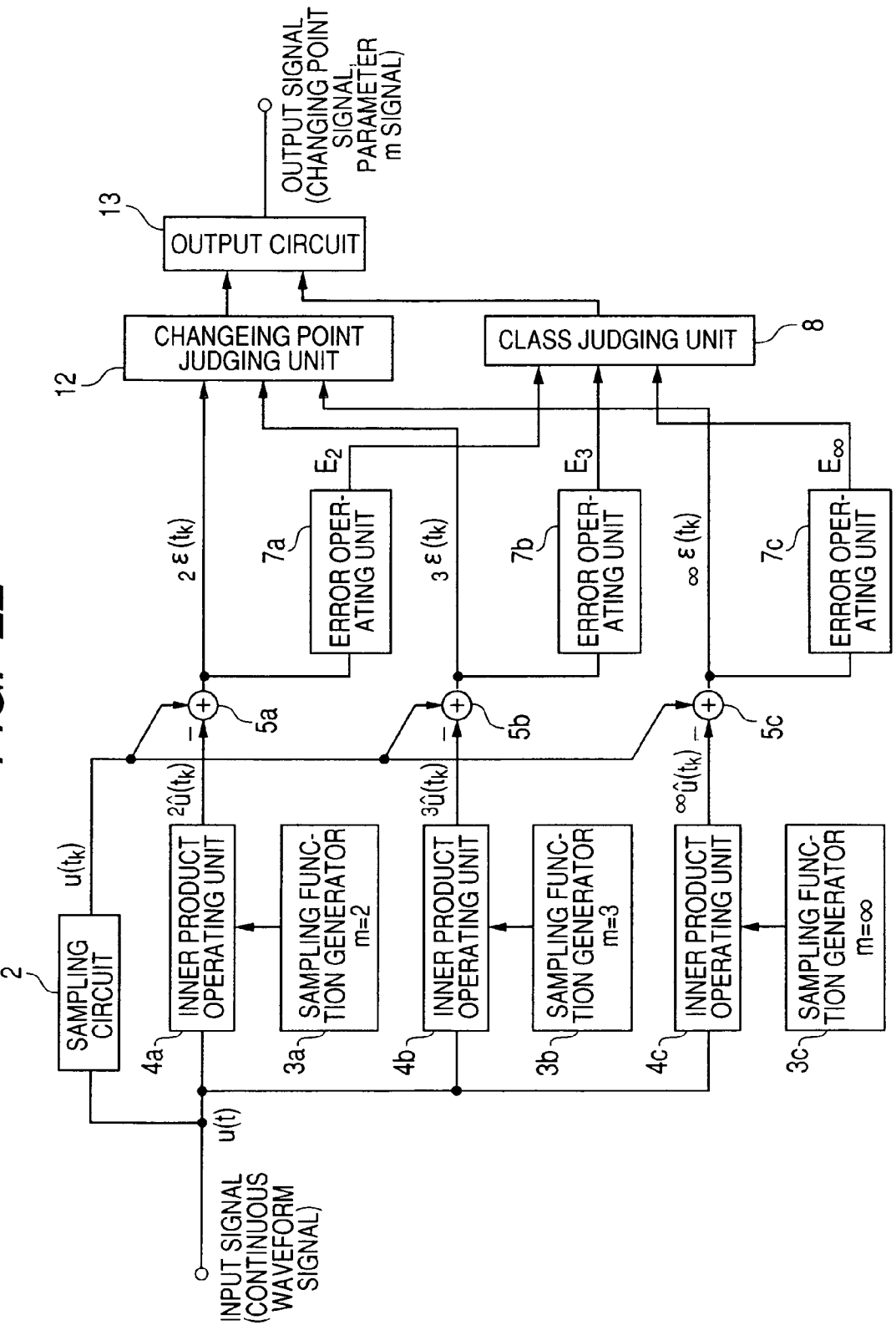
FIG. 22 is a configuration diagram showing a ninth embodiment of the invention.

FIG. 22 shows a ninth embodiment of the signal processing device according to the invention. The signal processing device according to the embodiment determines a changing point for parameter m using the sampling function based on the fluency information theory and outputs a changing point signal indicating the changing point. The embodiment is targeted for images such as text and diagrams and uses three types of parameters m=2, 3, and ∞. Obviously, the invention is not limited to these three types of parameters. For example, available parameters may be four such as m=1, 2, 3, and ∞ or may be only one such as m=2. Types of parameters can be selected depending on targets. When only parameter m=2 is available, this signifies that a diagram is composed of only polygonal lines.

The embodiment assumes that there is provided an approximate function representing an outline. The digital signal processing is used to output a signal indicating a changing point. The input signal is a digital continuous waveform signal resulting from separating an outline by small spans. The sampling function with m=2 or 3 is settled within the finite span 0 to $(J-1)\tau$, where J is the number of sampling points and $(J-1)\tau$ is the length. An inner product is taken within this span at every sampling point. The examples in the above FIGS. 2 and 3 present the sampling functions with m=2 and 3 when the center of the span is used as an origin. In both examples, the function span is J=13.

As mentioned above, the sampling function with m=∞ infinitely continues oscillation. The embodiment limits the span for this function to the same span for the function with m=2 or 3. A resulting slight error is allowable. To increase the processing accuracy for m=∞, the range of inner product can be wider than the above-mentioned one.

In FIG. 22, reference numeral 2 denotes a sampling circuit to assign a sampling point to each of points separating multiple small spans, sample an input signal at sampling interval τ, and output a sampling value at sampling point $k\tau=t_k$; 3 denotes sampling function generators to generate sampling functions with m=2, 3, and ∞ from top to bottom; 4 denotes an inner product operating unit to calculate an inner product between an input signal and the sampling function based on span 0 to $(J-1)\tau$ and output an inner product operating value; and 5 denotes a subtracter to subtract an inner product operating value output by the inner product operating unit 4 from a sampling value output by the sampling circuit 2 and output a difference. A file device (not shown) previously stores sampling functions with m=2, 3, and ∞ the sampling function generator 3 outputs. The functions are read each time an inner product is operated. One sampling interval approximately contains so many small spans that the input signal is assumed to be a continuous waveform signal.

The difference is compared with a predetermined threshold value. When a difference for any parameter m exceeds the threshold value, that point is assumed to be a changing point. In FIG. 22, reference numeral 12 denotes a changing point judging unit that compares a difference for each parameter m with the threshold value to determine a changing point. The changing point is represented by ordinal position k for the corresponding sampling point counted from a coordinate point on the image's XY coordinate or from the first sampling point.

The image reproduction uses the changing point information. Depending on image properties, it may be effective to use the information about parameter m as well during reproduction. In such case, the class judging unit 8 is added in FIG. 22. The class judgment, i.e., the determination of parameter m is performed after an error operation for the difference. The error operation uses a sum of squares or an arithmetic sum of absolute values for the differences depending on input signal properties. A sum operation is applied to errors at the sampling points (tk, tk+1, ..., and tk+(N−2)) within the span 0 to (N−1)□. Another available error operation may select an absolute value for the maximum difference in an operation span. The operation span is represented by N. Relatively large values are selected for N when a still picture is used as an input signal and is processed offline. In FIG. 22, reference numeral 7 denotes an error operating unit to perform the above-mentioned error operation for differences between each of the sampling points within the span 0 to $(N-1)\tau$. In FIG. 22, reference numeral 13 denotes an output circuit to output a changing point signal indicating the changing point and a parameter m signal indicating parameter m as digital output signals. The parameter m signal only needs to be capable of identifying one of three parameters m=2, 3, and ∞ and therefore can be represented using a 2-bit code.

Signals at each of the connection points in FIG. 22 include an input signal supplied to the inner product operating unit 4, a sampling value for the input signal, a sampling value resulting from the inner product operation, an error in output from the subtracter 5, and an error operation value. These signals are indicated similarly to the first embodiment.

The signal processing device according to the embodiment can be constructed as hardware using digital circuits and memory for the corresponding components. The signal processing device can be also constructed as software, i.e., a program executed on a computer. In this case, the signal processing device is mainly composed of: a central processing unit (CPU); memory to temporarily store such as data being operated; and a file device to store the signal processing program, sampling functions, and the like. The signal processing program provides the procedure for a computer to execute each of the processing shown in FIG. 22. The signal processing program is available as an independent program that is stored on recording media such as CD-ROM (Compact Disc-Read Only Memory).

When one type of parameter m is available, there are available one inner product operating unit 4 and one sampling function generator 3 in FIG. 22. The error operating unit 7 and the class judging unit 8 are omitted.

When an analog signal is used as the input signal according to the embodiment, the analog input signal is once sampled at the above-mentioned small span and is PCM coded. In addition, when the input signal is an analog signal, an analog signal processing can be used to process signals to acquire a changing point signal. In this case, analog circuits are used for the device components in FIG. 22.

Figure 23:
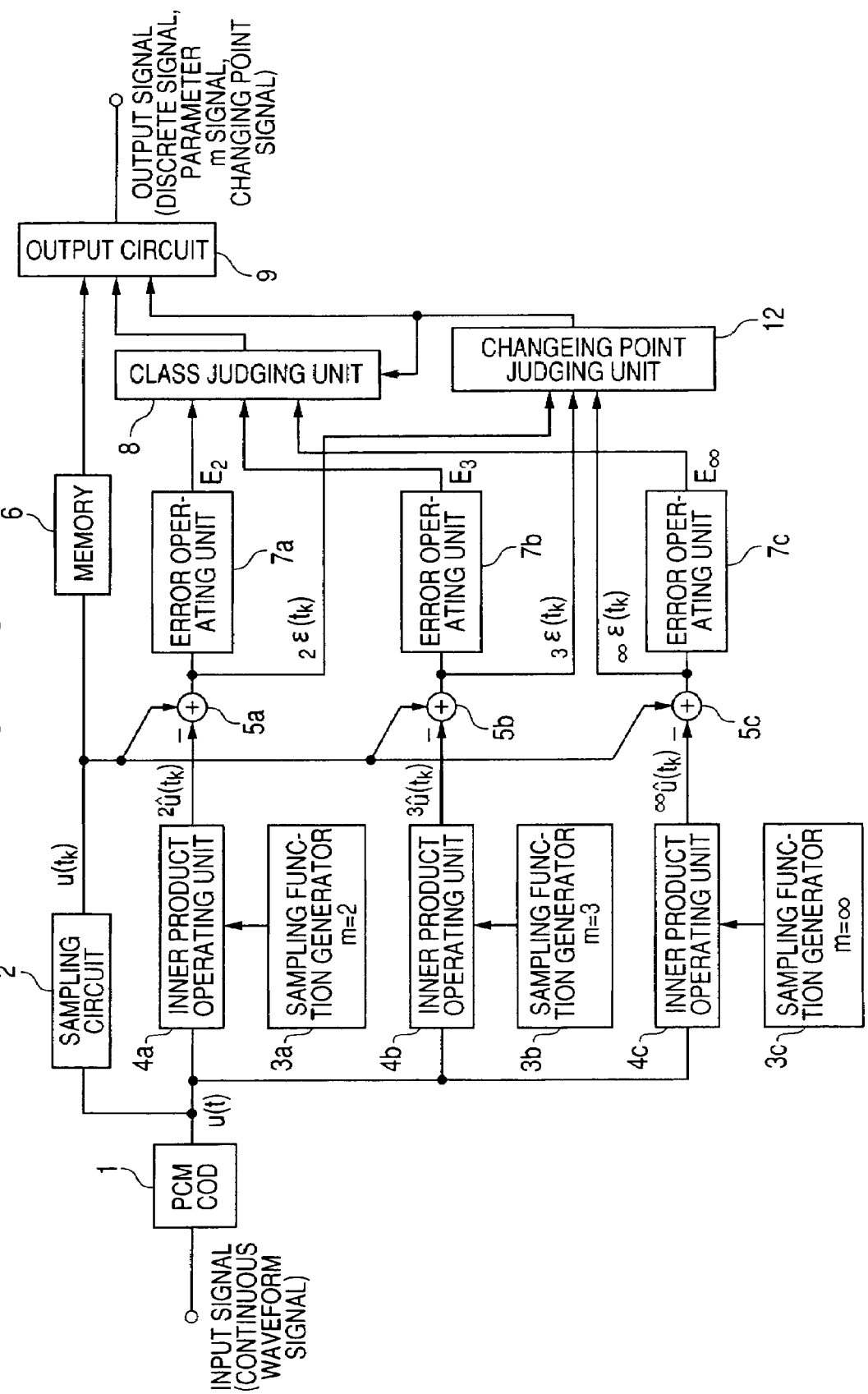
FIG. 23 is a configuration diagram showing a tenth embodiment of the invention.

FIG. 23 shows a tenth embodiment of the signal processing device according to the invention. The embodiment is targeted for images such as text and diagrams and uses three types of parameters m=2, 3, and ∞. Obviously, the invention is not limited to these three types of parameters. For example, available parameters may be four such as m=1, 2, 3, and ∞ or may be only one such as m=2. Types of parameters can be selected depending on targets.

The embodiment assumes the use of the inverse sampling function to reproduce images. A digital signal processing is used to process signals to output a signal indicating a changing point, a signal indicating parameter m, and a discrete signal. The input signal is a digital continuous waveform signal resulting from separating an outline by small spans. The sampling functions with m=2, 3, and ∞ are the same as those used for the ninth embodiment.

In FIG. 23, reference numeral 2 denotes a sampling circuit to assign a sampling point to each of points separating multiple small spans, sample an input signal at sampling interval τ, and output a sampling value at sampling point kτ=$t_k$; 3 denotes sampling function generators to generate sampling functions with m=2, 3, and ∞ from top to bottom; 4 denotes an inner product operating unit to calculate an inner product between an input signal and the sampling function based on span 0 to (J−1)τ and output an inner product operating value; and 5 denotes a subtracter to subtract an inner product operating value output by the inner product operating unit 4 from a sampling value output by the sampling circuit 2 and output a difference. A file device (not shown) previously stores sampling functions with m=2, 3, and ∞ the sampling function generator 3 outputs. The functions are read each time an inner product is operated. One sampling interval approximately contains so many small spans that the input signal is assumed to be a continuous waveform signal.

An error operation is performed for the above-mentioned difference. Parameters m are then compared to be determined. The error operation uses a sum of squares or an arithmetic sum of absolute values for the differences depending on input signal properties. A sum operation is applied to errors at the sampling points ($t_k$, $t_{k+1}$, ..., and $t_{k+(N-2)}$) within the span 0 to (N−1)τ. Another available error operation may select an absolute value for the maximum difference in an operation span. The operation span is represented by N. Relatively large values are selected for N when a still picture is used as an input signal and is processed offline.

Further, in FIG. 23, reference numeral 7 denotes an error operating unit to perform the above-mentioned error operation for differences between each of the sampling points within the span 0 to (N−1)τ; and 8 denotes a class judging unit that has a comparator, compares error operation results concerning parameters m=2, 3, and ∞ from the error operating unit to detect the minimum parameter, and outputs a parameter m signal indicating that parameter m. Reference numeral 6 denotes memory for adjusting a time delay due to processing by the error operating unit 7 and the class judging unit 8 with reference to sampling values output from the sampling circuit 2.

In FIG. 23, reference numeral 11 denotes a changing point judging unit to compare errors for m=2, 3, and ∞ from the subtracter 5 with a predetermined threshold value. There may be a case where all errors exceed the threshold value. In this case, the changing point judging unit 11 determines that sampling point to be a changing point and outputs a changing point signal.

The sampling circuit 2 outputs a sampling value at every sampling interval □ to form a string of sampling values that then result in a discrete signal. In FIG. 23, reference numeral 9 denotes an output circuit that combines the discrete signal, the parameter m signal, and the changing point signal with each other to form and output a digital output signal. The combination is performed by packetizing the discrete signal and placing the parameter m signal and the switching point signal in the discrete signal's header, for example. The parameter m signal only needs to be capable of identifying one of three parameters m=2, 3, and ∞ and therefore can be represented using a 2-bit code, for example. The switching point signal only needs to be capable of identifying its presence or absence and therefore can be represented using a 1-bit code, for example. The discrete signal, the parameter m signal, and the switching point signal may be output individually instead of being combined with each other.

The signal processing device according to the embodiment can be constructed as hardware using digital circuits and memory for the corresponding components. The signal processing device can be also constructed as software, i.e., a program executed on a computer. In this case, the signal processing device is mainly composed of: a central processing unit (CPU); memory to temporarily store data being operated; and a file device to store the signal processing program, sampling functions, and the like. The signal processing program provides the procedure for a computer to execute each processing shown in FIG. 23. The signal processing program is available as an independent program that is stored on recording media such as CD-ROM.

When one type of parameter m is available, there are available one inner product operating unit 4 and one sampling function generator 3 in FIG. 23. The error operating unit 7 is omitted. The class judging unit 8 outputs a corresponding fixed parameter m signal.

Figure 24:
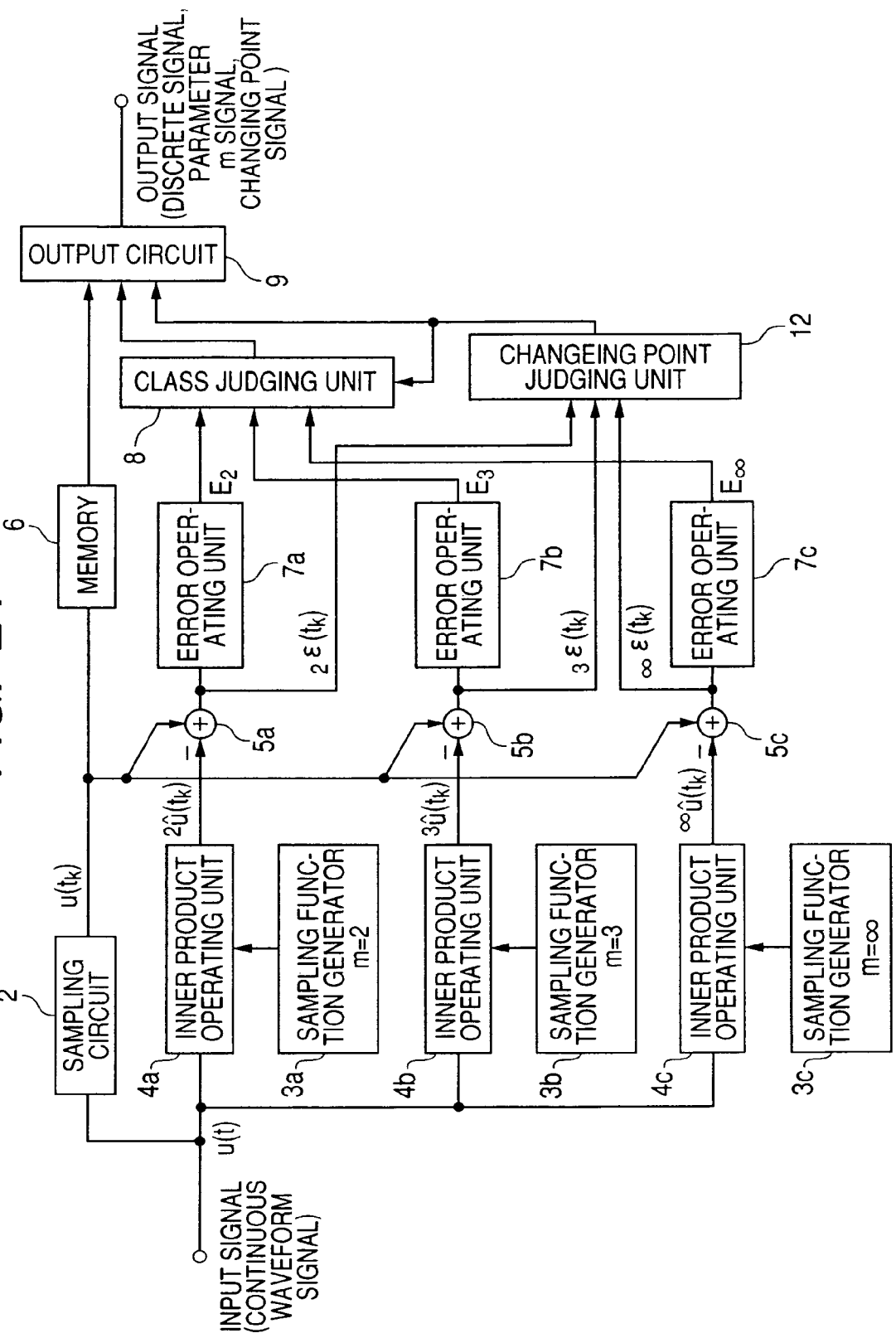
FIG. 24 is another configuration diagram showing the tenth embodiment of the invention.

The signal processing device according to the embodiment can also use an analog signal processing to generate a discrete signal from a continuous waveform signal. FIG. 24 shows the construction of the signal processing device using such analog signal processing. The device components are composed of analog circuits whose functions and operations are the same as those of the corresponding components in FIG. 23. As an exception, the output circuit 9 outputs analog output signals. In this case, the signals may be combined by inserting the parameter m signal into a blanking period of scanning for videos or images. A PCM coder can be used to previously encode and digitize discrete signals and the parameter m signal to be supplied to the output circuit 9. In this case, the output circuit 9 in FIG. 23 is used to output digital output signals.

Figure 25:
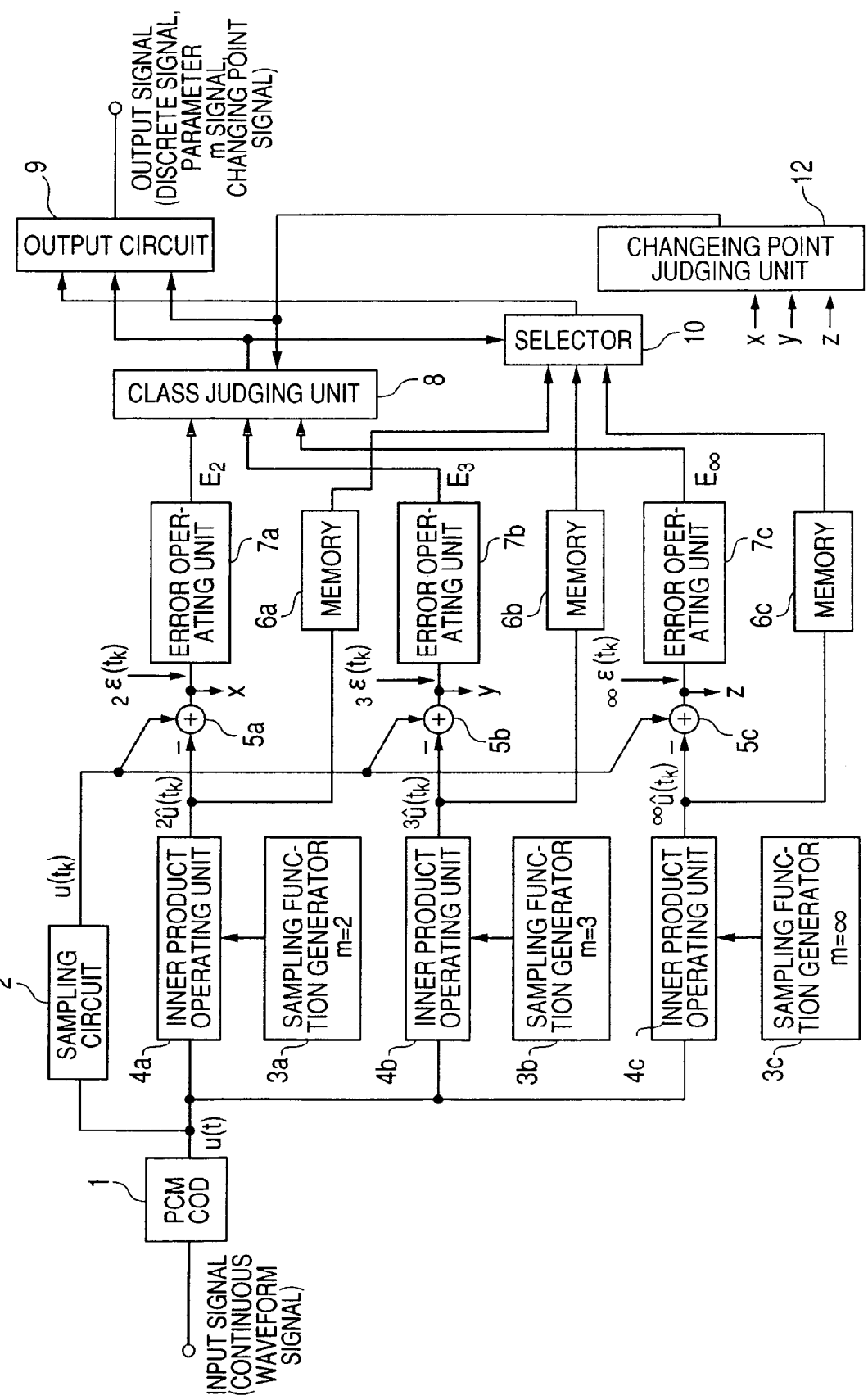
FIG. 25 is still another configuration diagram showing the tenth embodiment of the invention.

According to the embodiment, the inner product operating unit 4 outputs an inner product operating value for parameter m determined by the class judging unit 8. Since that parameter m matches parameter m of the input signal, the output inner product operating value approximately matches the sampling value of the sampling circuit 2. Accordingly, the inner product operating value can replace the sampling value to be supplied to the output circuit 9. In this case, a selector is provided to select an inner product operating value for the determined parameter m using the parameter m signal output from the class judging unit 8 and supply the output circuit 9 with the selected inner product operating value. FIG. 25 shows the construction that provides the selector. In FIG. 25, reference numeral 10 denotes the selector. In this manner, the signal processing device in FIG. 25 outputs a discrete signal composed of a string of inner product operating values. As mentioned above, the signal processing device in FIG. 23 outputs a discrete signal composed of a string of sampling values. Each of the inner product operating value and the sampling value is discrete values acquired at every sampling interval. Therefore, the discrete signal can be referred to as a discrete value string.

The following items may be also applicable to the principle of operations and processing flows of the signal processing device according to the ninth and tenth embodiments.

\<I\> Determining an Optimum Class for an Unknown Signal in a Partial Space of the Fluency Signal Space
  (1) Defining the Fluency Signal Space
  (2) Meaning of the Sampling Function
  (3) Using the Sampling Function to Specify a Class of Partial Signal Space to which an Unknown Signal Belongs However, these are the same as for the first through fourth embodiments and a description is omitted for simplicity.

Further, description is omitted about the inner product operating units 4 in FIGS. 22 and 23 constructed according to the above-mentioned theory because FIG. 9 shows the example of the inner product operating unit 4.

\<II\> Detecting a Changing Point

As mentioned above, the changing point includes a class switching point and a peculiar point.

(1) Class Switching Point

Let us suppose that a signal is represented by a string of signals with different classes. Such signal contains a point (class switching point) as a boundary between signals with different classes. The class switching point is detected based on a difference between an inner product operating value and an input signal's sampling value. The inner product operating value results from taking an inner product between the sampling function system and the original signal (input signal).

With reference to a point along a signal, the original signal may be represented by signals with different classes in the domains before and after that point. For example, the signal is represented as signal $$^{m_A}S$$

in domain A. The signal is represented as signal $$^{m_B}S$$

in domain B. The point separates domains based on the signals with different classes and is referred to as a class switching point represented by $P(m_A, m_B)$.

The class switching point $P(m_A, m_B)$ is classified as follows depending on properties at the point.

Figure 26:
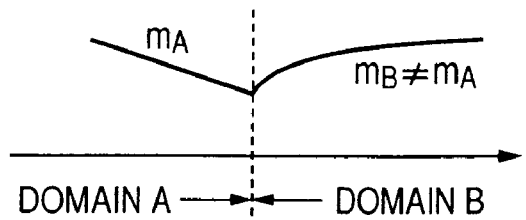
FIG. 26 is a first diagram showing a class switching point.

(i) The point $P(m_A, m_B)$ makes the signal continuous but undifferentiatable and satisfies the condition $m_A \neq m_B$. FIG. 26 exemplifies such class switching point.

Figure 27:
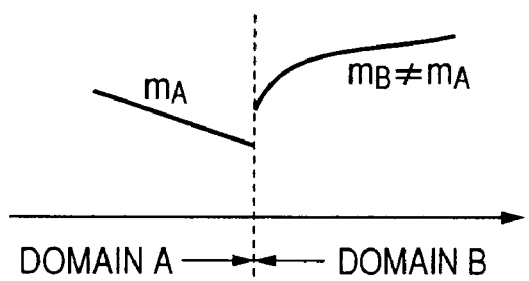
FIG. 27 is a second diagram showing a class switching point.

(ii) The point $P(m_A, m_B)$ makes the signal discontinuous and is therefore undifferentiatable and satisfies the condition $m_A \neq m_B$. FIG. 27 exemplifies such class switching point.

Figure 28:
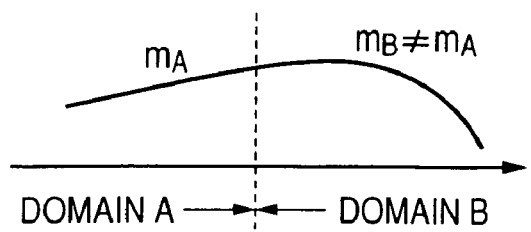
FIG. 28 is a third diagram showing a class switching point.

(iii) The point $P(m_A, m_B)$ makes the signal continuous and differentiatable and satisfies the condition $m_A \neq m_B$. FIG. 28 exemplifies such class switching point.

(2) Peculiar Point

A point, referred to as a peculiar point, undifferentiatably divides the domain into domains A and B. According to its properties, the peculiar point is classified as follows.

Figure 29:
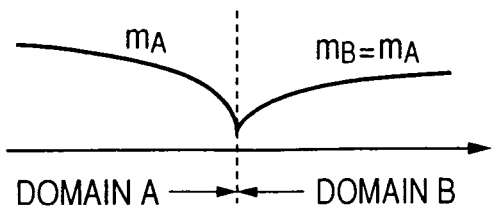
FIG. 29 is a first diagram showing a peculiar point.
Figure 30:
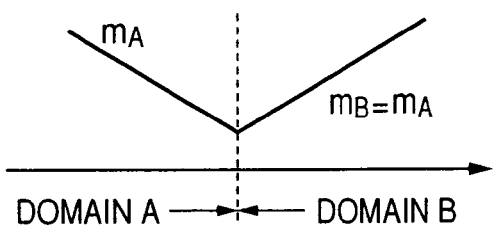
FIG. 30 is a second diagram showing a peculiar point.

(i) The point makes the signal continuous but undifferentiatable and satisfies the condition $m_A = m_B$. FIG. 29 exemplifies such peculiar point. Especially, when $m_A = m_B = 2$ is satisfied, for example, the peculiar point becomes a polygonal line's joining.

Figure 31:
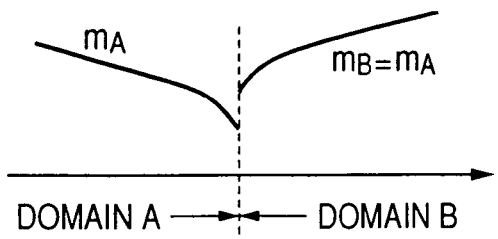
FIG. 31 is a third diagram showing a peculiar point.

(ii) The point makes the signal discontinuous and is therefore undifferentiatable and satisfies the condition $m_A = m_B$. FIG. 31 exemplifies such peculiar point.

(iii) The point makes the signal continuous or discontinuous and is therefore undifferentiatable and satisfies the condition $m_A \neq m_B$. Such peculiar point is the same as the class switching points (i) and (ii). Among class switching points, such peculiar point is referred to as an ultra peculiar point.

(3) Detecting the Changing Point

The ninth and tenth embodiments provide a difference between the sampling value and the inner product operating value. The difference becomes a small value (approximately 0) at a position short of the changing point containing the above-mentioned class switching point and the peculiar point because m matches parameter $m_A$. The difference becomes a large value because m differs from the other parameters m. The changing point provides a boundary where the differentiation is impossible or parameter m changes drastically. The difference value becomes large with reference to parameter $m_A$. In consideration for this, specified threshold value $\epsilon_{th}$ is provided. Differences for all parameters m may exceed threshold value $\epsilon_{th}$ at a point. This point can be determined to be the changing point.

Figure 32:
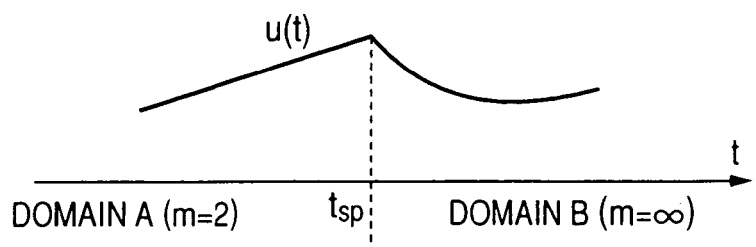
FIG. 32 shows detection of a changing point.

FIG. 32 provides an example of detecting such changing point. As shown in FIG. 32, let us suppose that signal u(t) is represented as a class m=2 signal (polygonal line) in a given span (domain A). In addition, let us suppose that signal u(t) is represented as a class m=∞ signal in another span (domain B) at t=$t_{sp}$ and later. Moreover, the signal is assumed to belong to a m=3 class.

(i) In domain A, an inner product operating value results from an inner product between sampling function $$[AD]^{m_0}\psi(t)$$

for class $m_0$ and signal u(t). There is a difference (expressed as $$_{m_0}\epsilon(A)$$

corresponding to domain A) between the inner product operating value and the input signal's sampling value. The errors are calculated with respect to $m_0$=2, 3, and ∞ to result in errors $_2\epsilon(A)$, $_3\epsilon(A)$, and $_\infty\epsilon(A)$. Of these errors, $_2\epsilon(A)$ becomes the minimum.

(ii) Similarly, errors $_2\epsilon(B)$, $_3\epsilon(B)$, and $_\infty\epsilon(B)$ are found in domain B. Of these, $_\infty\epsilon(B)$ becomes the minimum in this domain.

(iii) Errors $_2\epsilon(t_{sp})$, $_3\epsilon(t_{sp})$, and $_\infty\epsilon(t_{sp})$ are found in the vicinity of ultra peculiar point t=$t_{sp}$ where the class changes. Values $_2\epsilon$, $_3\epsilon$, and $_\infty\epsilon$ all become large, making it difficult to clearly specify a class. Based on this information, the class switching point is positioned.

Figure 33:
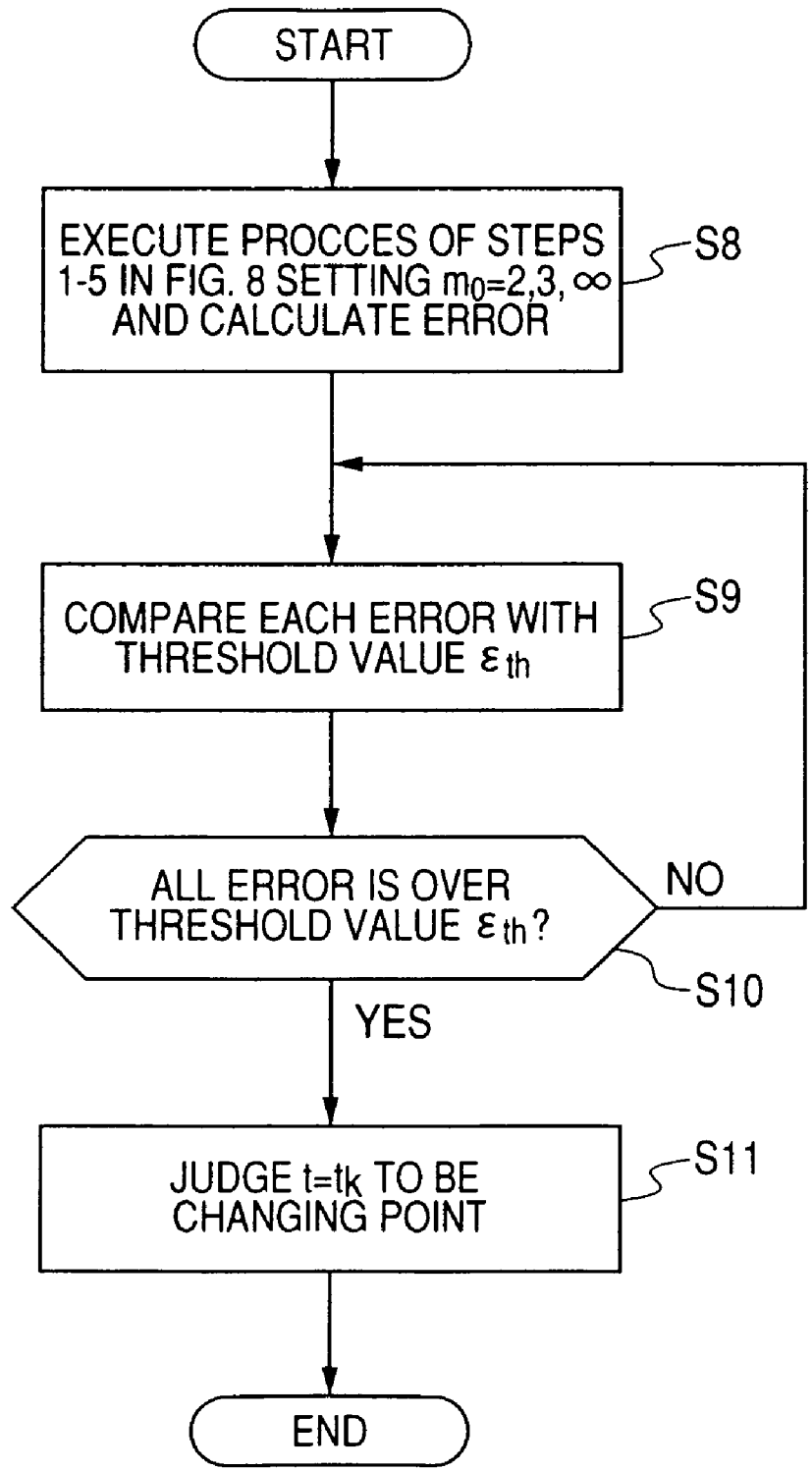
FIG. 33 is a flowchart showing a processing to detect a changing point.

With reference to FIG. 33, the following describes a class determination processing based on the above-mentioned principle. As mentioned above, the description concerns the example where the sampling function is applicable to the classes $m_0$=2, 3, and ∞.

At each of sampling points $t_k, t_{k+1}, \ldots,$ and $t_{k+(J-2)}$, the processing takes an inner product between input signal u(t) and the sampling function $$[AD]^{m_0}\psi(t)$$

to find an inner product operating value $$^{m_0}\hat{u}(t_k)$$

where k=k, k+1, . . . , and k+(J−2). The processing then calculates an error $$_{m_0}\epsilon(t_k)$$

between the calculated inner product operating value and the sampling value u($t_k$) for the input signal (Step S8). So far, the processing is the same as that at Steps S1 through S5 in FIG. 8 based on $m_0$=2, 3, and ∞.

The processing compares errors $_2\epsilon(t_k)$, $_3\epsilon(t_k)$, and $_\infty\epsilon(t_k)$ corresponding to each m0 with predetermined threshold value $\epsilon_{th}$ (Step S9). When all errors are greater than or equal to threshold value $\epsilon_{th}$ (Step S10), the processing assumes the point corresponding to t=$t_k$ to be a changing point (Step S11). At Step S10, there may be a case where all errors are not greater than or equal to threshold value $\epsilon_{th}$ and at least one error is smaller than or equal to $\epsilon_{th}$. In this case, the processing returns to Step S9.

According to the ninth and tenth embodiments as mentioned above, an inner product operation can be used to find changing points on an outline. The inner product operation contains the integration. Differently from the changing point detection using the differentiation as has been practiced so far, it is expected to decrease effects of noise during the changing point detection and reliably acquire highly accurate changing points.

In addition, the tenth embodiment clarifies the class belonging to the input signal to be processed during the signal processing to acquire a discrete signal from the input signal as the continuous waveform signal. It is expected to acquire parameter m signals indicating classes and changing point signals indicating changing points as well as discrete signals.

During the signal processing to generate a continuous waveform signal from a discrete signal, the parameter m signal and the changing point signal can be used to select the inverse sampling function corresponding to the parameter m. In this manner, it is possible to generate the continuous waveform signal using the inverse sampling function with parameter m matching the parameter m to which the discrete signal belongs. Consequently, it is possible to reproduce high-quality continuous waveform signals independently of band limitations according to the Shannon's sampling theorem.

Figure 34:
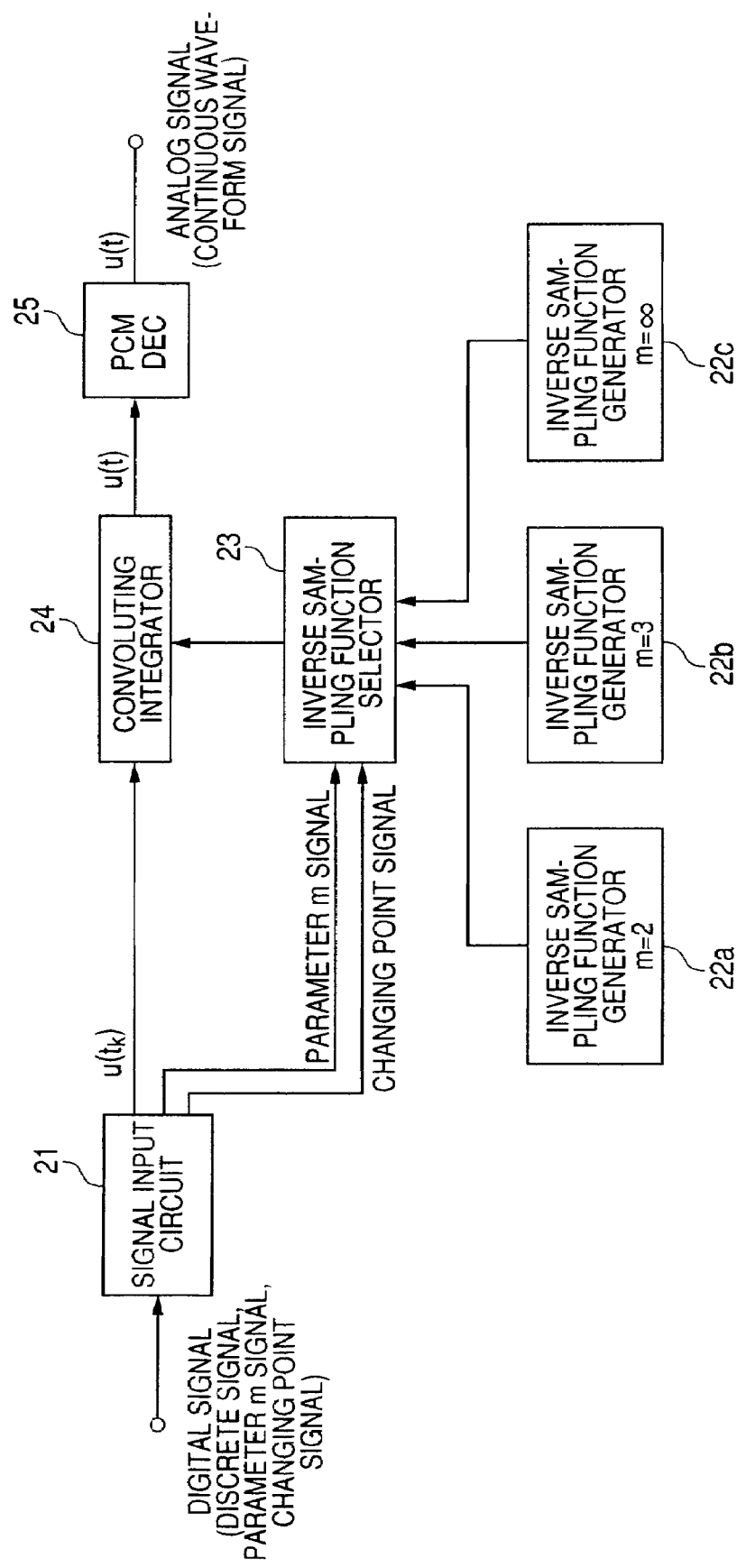
FIG. 34 is a configuration diagram showing an example of the signal processing device for acquiring a continuous waveform signal from a discrete signal.

To be more specific, the following describes a device for generating a continuous waveform signal from a discrete signal. FIG. 34 shows the configuration of the device. A signal supplied to the device is equivalent to a digital signal output from the signal processing device according to the ninth embodiment. The digital signal processing is performed to acquire the continuous waveform signal from a discrete signal.

The inverse sampling function used for the signal processing is biorthogonal to the above-mentioned sampling function that is used for the signal processing device according to the ninth embodiment. The inverse sampling function with m=2 and 3 is settled within the finite span 0 to (P−1)τ. The convoluting integration is performed at each sampling point within this span. When m is 3, P is typically set to 5. The inverse sampling function with m=∞ infinitely continues oscillation. Accordingly, the device limits the span for this function to the same span for the function with m=2 or 3. A resulting slight error is allowable. To increase the processing accuracy for m=∞, the range of convolution integration can be wider than the above-mentioned one.

In FIG. 34, reference numeral 21 denotes a signal input circuit that is supplied with a digital signal composed of a discrete signal as an original signal belonging to parameter m, a parameter m signal indicating the parameter m, and a changing point signal, and separates these signals from each other and outputs them; 22 denotes an inverse sampling function generator that generates an inverse sampling function for each of parameters m; 23 denotes an inverse sampling function selector that uses the parameter m signal and the changing point signal to select an inverse sampling function with parameter m corresponding to the discrete signal out of inverse sampling functions with each of parameter m output from the inverse sampling function generator 22; 24 denotes a convoluting integrator that acquires a continuous waveform signal by performing convolution integration between the discrete signal from the signal input circuit 21 and the inverse sampling function selected by the inverse sampling function selector 23; and 25 denotes a PCM decoder (PCMDEC) that outputs an analog signal equivalent to the continuous waveform signal output from the convoluting integrator 24. The inverse sampling functions for m=2, 3, and ∞ output from the inverse sampling function generator 22 are previously stored in a data file (not shown) of a storage device and are read each time a function is selected.

Figure 35:
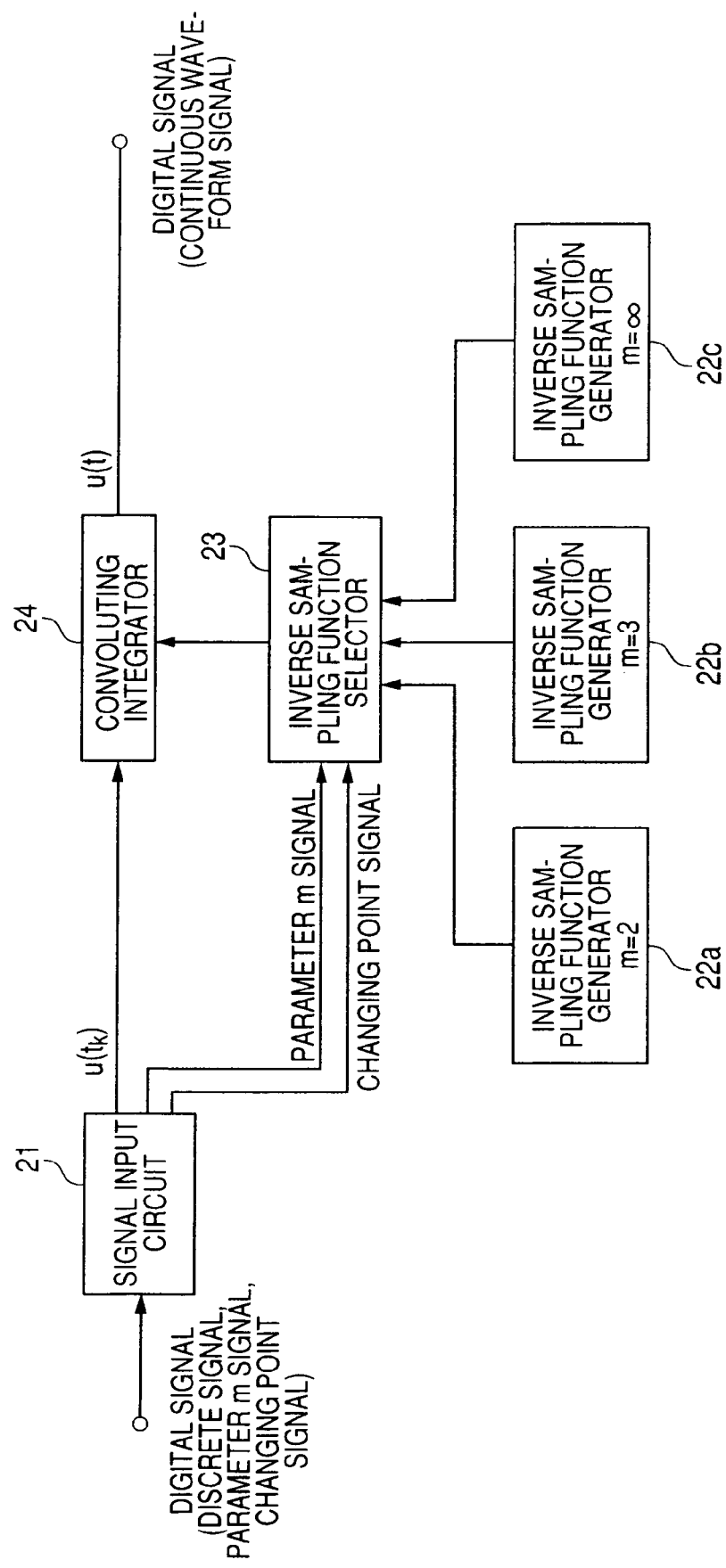
FIG. 35 is a configuration diagram showing another example of the signal processing device for acquiring a continuous waveform signal from a discrete signal.

The PCM decoder 25 is unnecessary when output signals from the signal processing device in FIG. 34 are supplied to a digital-input device (e.g., printer). FIG. 35 shows the configuration of the device that omits the PCM decoder 25 and outputs digital continuous waveform signals.

As mentioned above, the inverse sampling function with parameter m is expressed as follows.

$$[DA]^m \psi(t)$$

Further, as mentioned above, the inverse sampling function and the sampling function are associated with each other so as to be biorthogonal. In particular, the inverse sampling function is configured to be set to a given value at a targeted sampling point and reset to 0 at the other sampling points.

Equation (13) above expresses the convolution integration for DA operations. Operating equation (13) can yield continuous waveform signal u(t) that reproduces the original signal. Accordingly, a sampling value for sampling point $t_k$ is held for (P−1)τ from t=$t_k$. The held signal is multiplied by the inverse sampling function that starts being generated from t=$t_k$. The operation is performed as often as (P−2) times at a sampling interval of τ. The resulting products are added accumulatively in succession. The same operation is repeated from the next sampling point $t_{k+(P-1)}$ to operate the convolution integration and acquire continuous waveform signal u(t). As mentioned above, such processing to acquire a continuous waveform signal from discrete signals smoothly connects between discrete values using the DA function (inverse sampling function) with parameter m. The processing can be defined as an interpolation or a processing treatment to acquire a continuous signal.

In consideration for this, for example, the convoluting integrator 24 in FIG. 34 can be constructed as shown in FIG. 16. That is, the convoluting integrator 24 is composed of: delay circuits 51-1 through 51-(P−2) as many as (P−2) to delay the inverse sampling function by τ; holding circuits 52-0 through 52-(P−2) as many as (P−1) to hold sampling values for sampling points $t_k$, $t_{k+1}$, . . . , and $t_{k+(P-2)}$ at interval τ; multipliers 53-0 through 53-(P−2) as many as (P−1) to multiply a holding signal output from the holding circuit 52 by the inverse sampling function; and an accumulator 54 to accumulatively add output signals from the multiplier 53 in the order of output.

As mentioned above, the embodiment enables the signal processing using the inverse sampling functions appropriate to classes, making it possible to acquire high-quality reproduction signals.

According to the tenth embodiment, the signal processing devices in FIGS. 23 and 25 and the signal processing device provided with the PCM coder at the output side in FIG. 24 are supplied with analog continuous waveform signals and output digital discrete signals (discrete value strings). Therefore, the above signal processing devices can be interpreted as an AD converter. Similarly, the signal processing devices in FIGS. 34 and 35 can be interpreted as DA converters. When both devices construct an A-D/D-A conversion system, both devices may be directly connected or may be connected via a transmission system or a recording system. When data passes through the transmission system or the recording system, information compression coding or transmission path coding may be provided to decrease the amount of data. In this case, data passes through the transmission system or the recording system, and then is decoded and D-A converted.

When the transmission system is a communication system, it is available as Internet, cellular phone networks, and cable television, or ground-based broadcasting and satellite broadcasting using radio waves. The recording system can provide recording media such as CD (Compact Disc) and DVD (Digital Versatile Disc). Through the use of these technologies, it is expected to provide higher-precision image than ever before.

When the A-D/D-A conversion system is applied to a signboard production system, a print system, and the like, the system can provide much higher-precision images than ever before. Even when an image is enlarged or reduced, it is expected to maintain high quality, that is, provide high scalability.

INDUSTRIAL APPLICABILITY

The invention can be widely applied to information industries in general related to image, video, data, audio, and the like, i.e., recording media, internet, computers, printing, publishing, advertisement, and the like.

What is claimed is:

1. A signal processing method comprising the steps of:
providing a plurality of fluency analog/digital (A/D) functions classified with parameters m;
sampling a continuous input signal to get sampling values;
finding inner product operating values between the continuous input signal and a fluency A/D function selected from the plurality of fluency A/D functions;
judging differences between the sampling values and the inner product operating values; and
outputting the parameter m in which values of the differences come to minimum, and the sampling values or the inner product operating values.

2. The signal processing method according to claim 1, further comprising the steps of:
judging that there is a changing point before and behind a sampling point at which sampling is executed, when the values of the differences are larger than a predetermined tolerable value, the changing point being including at least one of a switching point in which the parameter m changes and a peculiar point in which no differentiation is possible to the input signal; and
outputting a changing point signal indicating the changing point.

3. The signal processing method according to claim 1, wherein each of the values of the differences is a value selected from the group consisting of a sum of squares of the gross differences between the sampling values and the inner product operating values at sampling points within a predetermined span, a sum of absolute values of the gross differences and the maximum of absolute values of the gross differences.

4. The signal processing method according to claim 1, wherein the parameter m is a parameter denoting that the fluency A/D function of the parameter m is continuously differentiable only as often as (m−2) times, and
wherein the parameters m contain at least three types which are m=2, 3, and ∞.

5. The signal processing method according to claim 1, wherein a destination of the parameter m in which the values of the differences come to minimum, and the sampling values or the inner product operating values is a recording medium or a communication means.

6. The signal processing method according to any one of claims 1, 2, 3, 4 or 5, wherein the continuous input signal corresponds to a discrete signal which is sampled at shorter sampling period than that for getting the sampling values and then encoded.

7. A signal processing device comprising:
a plurality of function generators which provide a plurality of fluency A/D functions classified with parameters m;
a sampling circuit which samples a continuous input signal to get sampling values;
a plurality of operating units which output inner product operating values by executing inner product operation between the continuous input signal and a fluency A/D function selected from the plurality of fluency A/D functions
a judging unit which judges differences between the sampling values and the inner product operating values outputted from the operating unit and determines the parameter m in which values of the differences come to minimum; and
an output device which outputs the determined parameters m and the sampling values or the inner product operating values.

* * * * *